(12) United States Patent
Esaki

(10) Patent No.: US 6,534,840 B2
(45) Date of Patent: Mar. 18, 2003

(54) SEMICONDUCTOR DEVICE HAVING SELF-ALIGNED STRUCTURE

(75) Inventor: Hideya Esaki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/774,638

(22) Filed: Feb. 1, 2001

(65) Prior Publication Data

US 2001/0050395 A1 Dec. 13, 2001

(30) Foreign Application Priority Data

Mar. 14, 2000 (JP) ........................................ 2000-071131

(51) Int. Cl.[7] .............................................. H01L 29/00

(52) U.S. Cl. ........................ 257/499; 257/506; 257/510

(58) Field of Search ................................ 257/327, 330, 257/331, 332, 333, 335, 336, 337, 374, 506, 510, 513, 499

(56) References Cited

U.S. PATENT DOCUMENTS

| | | | | |
|---|---|---|---|---|
| 6,130,121 A | * | 10/2000 | Sze | ............................. 438/167 |
| 6,239,472 B1 | * | 5/2001 | Shenoy | ......................... 257/338 |
| 6,291,282 B1 | * | 9/2001 | Wilk et al. | ................... 438/199 |

* cited by examiner

Primary Examiner—Olik Chaudhuri
Assistant Examiner—Hoai Pham
(74) Attorney, Agent, or Firm—Nixon Peabody LLP; Donald R. Studebaker

(57) ABSTRACT

A sidewall insulating film is formed on the side faces of a gate electrode on a substrate. A trench isolation film is also formed to be self-aligned with the gate electrode. The upper surface of the trench isolation film reaches a level higher than that of the gate electrode. And source/drain contacts, which make electrical contact with source/drain regions, are formed between the sidewall insulating film and the isolation film. Since the source/drain contacts and the isolation film are both self-aligned with the gate electrode, no mask overlay margin is needed. Thus, the size of the entire active region or the source/drain contacts (or source/drain regions) can be reduced in the gate length direction.

8 Claims, 24 Drawing Sheets

SEMICONDUCTOR DEVICE HAVING SELF-ALIGNED STRUCTURE

BACKGROUND OF THE INVENTION

The present invention relates to a semiconductor device with its isolation film and source/drain contacts self-aligned with its gate electrode and a method for fabricating a device with such a structure.

Recently, the number of semiconductor devices that can be integrated on a single chip has increased by leaps and bounds as those devices have been tremendously downsized. As this miniaturization trend accelerates, a contact hole (or a contact formed by filling in the hole with a conductor), provided for interconnecting the gate electrode or doped layer of an MIS semiconductor device to an interconnection layer, has further reduced its size every time size generations alternate.

To reduce a margin needed in overlaying masks one upon the other during a photolithographic process and thereby further increase the number of semiconductor devices integrated, various methods for forming contacts self-aligned with a gate electrode have been researched and developed vigorously. Those contacts will be herein called "self-aligned contacts". Hereinafter, a semiconductor device including the known self-aligned contacts and its fabrication process will be described.

FIG. 22 illustrates a cross section of a known MIS semi-conductor device, including self-aligned contacts, taken in the channel direction (i.e., the gate length direction) thereof. As shown in FIG. 22, a trench isolation film 104 is provided on an Si substrate 101 and an MIS transistor is formed in an active region surrounded by the isolation film 104. The MIS transistor includes: a gate insulating film 105 of $SiO_2$; a gate electrode 106 of polysilicon; an upper insulating film 107 of SiN; a nitride sidewall 109 of SiN; LDD regions 108; and heavily doped source/drain regions 110. The gate insulating film 105, gate electrode 106 and upper insulating film 107 are stacked in this order on the Si substrate 101 and the side faces of the gate electrode 106 and upper insulating film 107 are covered with the nitride sidewall 109. The LDD and heavily doped source/drain regions 108 and 110 are defined in the Si substrate 101 by introducing dopants thereto. Contacts 112 of tungsten, for example, are formed to pass through an interlevel dielectric film 111 over the Si substrate 101 and to reach the heavily doped source/drain regions 110. Depending on the direction of mask misalignment, these contacts 112 come into partial contact with the upper insulating film 107 and nitride sidewall 109. And these contacts 112 are self-aligned contacts that have been automatically aligned with the gate electrode 106.

FIGS. 23A through 23E are cross-sectional views illustrating respective process steps for fabricating the MIS semi-conductor device including the known self-aligned contacts.

First, in the process step shown in FIG. 23A, a stopper insulating film 102, which may be a multilayer structure consisting of silicon dioxide and silicon nitride films, is deposited on an Si substrate 101. Then, parts of the stopper insulating film 102 and Si substrate 101, where the trench isolation will be formed, are etched to a predetermined depth, thereby forming a trench 103 in the Si substrate 101.

Next, in the process step shown in FIG. 23B, a CVD silicon dioxide film is deposited over the substrate and has its surface planarized by a chemical/mechanical polishing (CMP) process using the stopper insulating film 102 as a polish stopper. In this manner, the trench 103 is filled in with the CVD silicon dioxide film, thereby forming the isolation film 104. As a result, the upper surfaces of the isolation film 104 and stopper insulating film 102 are planarized to the same level. Once a desired planarity is attained, the stopper insulating film 102 is removed.

Then, in the process step shown in FIG. 23C, the exposed surface of the Si substrate 101 is thermally oxidized, thereby forming a gate insulating film 105 of $SiO_2$. Subsequently, after polysilicon and silicon nitride film have been stacked in this order over the substrate, these two films are patterned by lithography and dry etching techniques to form a gate electrode 106 and an upper insulating film 107 in the active region. Thereafter, dopant ions are lightly implanted into the Si substrate 101 using the upper insulating film 107 and trench isolation film 104 as a mask, thereby defining LDD regions 108 that are self-aligned with the gate electrode 106.

Next, in the process step shown in FIG. 23D, a silicon nitride film is deposited over the substrate and then etched back, thereby forming a nitride sidewall 109 over the side faces of the upper insulating film 107 and gate electrode 106. Thereafter, dopant ions are heavily implanted into the Si substrate 101 using the upper insulating film 107, nitride sidewall 109 and trench isolation film 104 as a mask, thereby defining heavily doped source/drain regions 110 that are self-aligned with the gate electrode 106.

Subsequently, in the process step shown in FIG. 23E, a relatively thick CVD silicon dioxide film is deposited over the substrate and then planarized by a CMP process, thereby forming an interlevel dielectric film 111. Thereafter, contact holes, reaching the heavily doped source/drain regions 110, are opened through the interlevel dielectric film 111 and filled in with a conductor, thereby obtaining source/drain contacts 112 that make electrical contact with the heavily doped source/drain regions 110.

According to this method, when the contact holes are opened through the interlevel dielectric film 111 so as to reach the heavily doped source/drain regions 110, the gate electrode 106 has already been covered with the SiN upper insulating film 107 and nitride sidewall 109. Thus, even if these contact holes have been formed to overlap with the gate electrode 106 due to mask misalignment, the silicon nitride film 107 serves as an etch stopper. As a result, the source/drain contacts 112 can be formed as self-aligned contacts without making the contact holes partially etch the gate electrode 106.

The semiconductor device including the known self-aligned contacts and its fabrication process, however, has the following drawbacks.

Firstly, according to the known method of making the self-aligned contacts, the source/drain contacts must be formed within the contact holes that have been prepared by lithography and dry etching processes. Thus, the size of the source/drain contacts can be reduced to no smaller than the minimum opening size of a resist pattern for use in an exposure process.

The self-aligning technique for the known self-aligned contacts was developed to form the contact holes, reaching the source/drain regions, without getting the gate electrode etched even if those holes horizontally overlap with the gate electrode due to the placement error of photomasks for use in making the holes. This is because the upper and side faces of the gate electrode have already been covered with the silicon nitride film when those holes are opened. That is to say, this self-aligned contact making method was designed to increase an allowable mask overlay margin for a photolithographic process for forming the contact holes. Thus, the size of the contact holes themselves, in which the contacts should be formed by filling the holes with a conductor, is determined by the minimum opening size of a resist pattern.

FIG. 24A is a cross-sectional view illustrating an MIS transistor including the known self-aligned contacts along with the sizes of respective parts of the transistor. FIG. 24B is a plan view illustrating a photomask used for forming the contact holes.

As shown in FIG. 24A, the contact holes 114 reaching the heavily doped source/drain regions 110 are formed by etching the interlevel dielectric film 111 using a resist pattern 113 as a mask. Thus, it is impossible to reduce the size of the contact holes 114, in which the source/drain contacts should be formed, to less than the minimum opening size of the resist pattern 113 (i.e., a positive photoresist film in the illustrated example). The lower part 114a of the contact hole 114 on the left-hand side, located between the nitride sidewall 109 and interlevel dielectric film 111, has a size smaller than the minimum opening size. However, this part 114a is formed due to the mask misalignment and this size is non-controllable. Accordingly, when a contact is formed inside the contact hole 114, the area of contact between the contact and the heavily doped source/drain region 110 is smaller than the desired one. On the other hand, the upper part 114b of the contact hole 114 has a size approximately equal to the minimum opening size. Thus, it is virtually impossible to reduce the area of contact between the contact formed inside the contact hole 114 and an interconnection line, which will be formed on the contact, to less than the minimum opening size.

According to a normal exposure technique, the gate length determined by a resist pattern for a gate electrode (i.e., the length of the resultant gate electrode 106) may be equal to the minimum opening size (or the design rule in this case), e.g., 0.15 μm. However, the resolution of a resist pattern with no line-and-space pattern, e.g., a resist pattern for making contact holes, is lower than that of a gate electrode pattern. Accordingly, openings with the minimum size of 0.15 μm cannot be formed, and therefore the minimum opening size of the resist pattern 113 shown in FIG. 24A is about 0.2 μm in a normal case. Thus, if the gate length of the gate electrode is defined at the minimum opening size, it is difficult to reduce the size of the source/drain contacts (or contact holes) to approximately equal to, or less than, the gate length in accordance with the currently available technique.

Secondly, the relative positional relationship among the gate electrode, trench isolation film and source/drain contacts is changeable depending on the mask overlay accuracy of an exposure system. Thus, an extra mask overlay margin is needed and the area of the active region cannot be reduced proportionally to a reduced design rule. Accordingly, it is now very difficult to further reduce the areas of the source/drain regions or the coupling capacitance formed between the source/drain regions and the substrate.

Usually, a photomask is designed in such a shape that the contact holes 114 will not overlap with the gate electrode 106 but will be located over the heavily doped source/drain regions 110 as shown in FIG. 24B. Suppose a semiconductor device has been formed by using such a photomask and by setting the mask overlay margin to zero and the gate length of the gate electrode 106 to the minimum opening size. In that case, the sizes of respective parts of the semiconductor device as measured in the channel direction (i.e., the gate length direction) will be as shown in FIG. 24A. The gate length of the gate electrode 106 will be 0.15 μm. The horizontal size of the nitride sidewall 109 will be 0.12 μm in total (i.e., 0.6 μm each side). And the size of part of the source/drain region 110 that is located between the nitride sidewall 109 and trench isolation film 104 as measured in the gate length direction will be 0.4 μm in total (i.e., 0.2 μm each side). As described above, this size is approximately equal to the designed size of the contact holes 114. Add all of these sizes together, and the size of the entire active region interposed between the right- and left-hand side portions of the isolation film 104 will be about 0.67 μm as measured in the gate length direction. The size of the active region except the gate electrode 106 with the length of 0.15 μm will be about 0.52 μm in total (i.e., 0.26 μm each side) as measured in the gate length direction. The size of the heavily doped source/drain regions 110, including their parts diffused under the gate electrode 106, will also be about 0.52 μm in total (i.e., 0.26 μm each side) as measured in the gate length direction. On the other hand, supposing a mask overlay margin of about 0.01 μm is needed in aligning each pair of parts with each other, the size of the entire active region will be about 0.75 μm as measured in the gate length direction. Even if the design rule for a gate electrode, for example, has been reduced, this mask overlay margin does not decrease proportionally. Since it is expected that the design rule will be continuously reduced from now on, the mask overlay margin will constitute an increasingly great obstacle to downsizing of semiconductor devices.

According to the sizes specified above, the sizes of the active region and heavily doped source/drain regions as measured in the gate length direction are five or more times greater and four or more times greater than the gate length, respectively. Thus, it is necessary, but very difficult, to further reduce these sizes of the active region and heavily doped source/drain regions for the purpose of downsizing the semiconductor devices and reducing the junction capacitance.

SUMMARY OF THE INVENTION

To further downsize the semiconductor devices, the present invention adopts a completely new approach, which is totally different from the prior art.

An object of this invention is providing a downsized semiconductor device, of which the components can be freely disposed in an active region without being limited by the mask overlay margin, by self-aligning not only the contacts but also the isolation film as well with the gate electrode.

Another object of this invention is providing a method for fabricating the device by this new self-aligning technique.

An inventive semiconductor device includes: a gate insulating film formed on a semiconductor substrate; a gate electrode formed on the gate insulating film; an upper insulating film formed on the gate electrode; and a trench isolation film self-aligned with the gate electrode. The upper surface of the isolation film is located at a level higher than the upper surface of the gate electrode. The lower surface of the isolation film is located at a level lower than the upper surface of the substrate at least on a cross section of the device taken in a gate length direction. The device further includes: source/drain diffused regions defined in respective regions of the substrate beside the gate electrode; source/drain contacts formed between the gate electrode and the isolation film and self-aligned with the gate electrode to make electrical contact with the source/drain diffused regions; and a sidewall insulating film interposed between the source/drain contacts and a stack of the gate electrode and the upper insulating film.

In the inventive semiconductor device, the upper surface of the trench isolation film is higher than that of the gate electrode and the source/drain contacts are interposed between the gate electrode and the isolation film. In addition, since the source/drain contacts and the isolation film are both self-aligned with the gate electrode, no mask overlay margin is needed. Accordingly, the active region, surrounded by the isolation film, can have its size reduced in the gate length direction.

In one embodiment of the present invention, as viewed from over the device, the source/drain contacts are preferably in substantially the same planar shape as the source/drain diffused regions in respective areas where the contacts overlap the diffused regions, and are preferably formed only over the diffused regions. Unlike the known source/drain contacts, which are formed by filling in contact holes with a conductor, the contacts can be made in any size. That is to say, the size of the source/drain contacts as measured in the gate length direction can be smaller than the minimum opening size. For example, the size of the source/drain contacts as measured in the gate length direction may be in the range from 0.01 $\mu$m to 0.1 $\mu$m.

In another embodiment of the present invention, the respective upper surfaces of the upper insulating film, the isolation film and the source/drain contacts are preferably planarized to substantially the same levels. In that case, the planarity of the substrate increases as a whole, thus improving the reliability of upper-level interconnects, for example.

In still another embodiment, on a transversal cross section of the device taken across a part of the gate electrode, a periphery, outlining the sidewall insulating film, the gate electrode and the source/drain contacts, is preferably surrounded by the isolation film. Then, the isolation capability of the semiconductor device improves.

In yet another embodiment, the gate electrode in its entirety is preferably located only over the gate insulating film.

In still another embodiment, on a transversal cross section of the device taken across a part of the gate electrode, a trench may be provided in the substrate around a periphery outlining the sidewall insulating film, the gate electrode and the source/drain contacts, and filled in with the isolation film.

In still another embodiment, on a cross section of the device taken in a gate width direction, the isolation film may be formed only over the upper surface of the substrate. And the device may further include a gate-width-defining trench isolation film, which reaches at least a region under a portion of the gate electrode where a contact will be formed on the cross section taken in the gate width direction. In such an embodiment, the channel region is sandwiched by the gate-width-defining trench isolation film, thus reducing the variation in electrical characteristics of the semiconductor device.

An inventive method for fabricating a semiconductor device includes the steps of: a) forming a first insulating film, a conductor film and a second insulating film in this order over a semiconductor substrate, where the first insulating film and the conductor film will be shaped into a gate insulating film and a gate electrode, respectively; b) forming an upper insulating film and the gate electrode by patterning at least the second insulating film and the conductor film, respectively; c) forming a self-aligned sidewall film on the side faces of the gate electrode so that the sidewall film is self-aligned with the gate electrode; and d) etching the substrate to a predetermined depth using the upper insulating film and the self-aligned sidewall film as a mask, thereby forming a trench self-aligned with the gate electrode.

According to the inventive method, the trench can be formed to be self-aligned with the gate electrode. Thus, the size of the regions interposed between the gate electrode and the trench can be reduced in the gate length direction.

In one embodiment of the present invention, two types of selectively etchable insulating films may be stacked one upon the other in the step a) as the second insulating film. And in the step b), a stack of first and second upper insulating films may be formed as the upper insulating film. In such an embodiment, the substrate can be planarized more easily after that.

In another embodiment of the present invention, the method may further include the steps of: e) forming a third insulating film over the substrate after the step d) has been performed; and f) removing part of the third insulating film at least until the surfaces of the upper insulating film and the self-aligned sidewall film are exposed, thereby forming a trench isolation film that extends from the bottom of the trench and reaches a level at least higher than the upper surface of the gate electrode. In this manner, the isolation film can be formed to be self-aligned with the gate electrode.

In this particular embodiment, the respective upper surfaces of the upper insulating film, the self-aligned sidewall film and the isolation film are preferably planarized in the step f) to substantially the same levels by a CMP process.

In an alternative embodiment, two types of selectively etchable insulating films may be stacked one upon the other in the step a) as the second insulating film. In the step b), a stack of first and second upper insulating films may be formed as the upper insulating film. And in the step f), parts of the third insulating film, the second upper insulating film and the self-aligned sidewall film may be removed until the surface of the first upper insulating film is exposed. A self-aligned sidewall film of a good shape can be obtained by doing so. Accordingly, whether this self-aligned sidewall film is used as the source/drain contacts themselves or their dummies, the reliability of the resultant semiconductor device improves.

In this particular embodiment, the respective upper surfaces of the first upper insulating film, the self-aligned sidewall film and the isolation film are preferably planarized in the step f) to substantially the same levels by a CMP process.

In still another embodiment, the method may further include the steps of: g) selectively removing the self-aligned sidewall film after the step f) has been performed, thereby forming contact holes reaching the substrate; h) filling the contact holes with a conductor, thereby forming source/drain contacts that reach source/drain diffused regions and are self-aligned with the gate electrode; i) introducing a dopant into respective regions of the substrate beside the gate electrode to define the source/drain diffused regions self-aligned with the gate electrode; and j) forming a sidewall insulating film between the source/drain contacts and the stack of the gate electrode and the upper insulating film. The step i) may be performed after the step b) has been performed, while the step j) may be performed at any point between the steps b) and h). In such an embodiment, respective parts of the semiconductor device can be self-aligned with the gate electrode. Thus, the device can be downsized much more easily.

In this particular embodiment, the step j) may be performed after the step b) so that the sidewall insulating film is left on the side faces of the upper insulating film and the gate electrode.

In this case, the step i) may include the sub-steps of: i-1) defining lightly doped source/drain regions in the substrate by implanting dopant ions lightly into the substrate using the gate electrode as a mask; and i-2) defining heavily doped source/drain regions in the substrate by implanting the dopant ions heavily into the substrate using the gate electrode and the sidewall insulating film as a mask. The step i-1) is preferably performed between the steps b) and j), while the step i-2) is preferably performed after the step j). In this manner, an MIS transistor with a so-called LDD structure can be formed easily with its short channel effect preventing function much improved.

In still another embodiment, the step i) may be performed as an ion implantation process using at least the gate electrode and the isolation film as a mask between the steps g) and h).

In yet another embodiment, the source/drain contacts containing a dopant may be formed in the step h), and the step i) may be performed by diffusing the dopant from the source/drain contacts into the substrate after the step h) has been performed. In such an embodiment, the source/drain regions with a shallow diffusion depth can be formed.

In yet another embodiment, the method may further include the steps of: g) defining source/drain diffused regions in respective regions of the substrate beside the gate electrode between the steps b) and c); and h) forming a sidewall insulating film on the side faces of the upper insulating film and the gate electrode between the steps b) and c). In the step c), a conductor film, which will be source/drain contacts, may be formed as the self-aligned sidewall film on the sidewall insulating film. In such an embodiment, there is no need to perform the steps of forming contact holes by partially removing the self-aligned sidewall film and filling the contact holes with a conductor film, thus simplifying the fabrication process.

In still another embodiment, the method may further include the step of forming a gate-width-defining trench isolation film in the substrate before the step a) is performed. In such an embodiment, the variation in electrical characteristics of the semiconductor device can be suppressed.

BRIEF DESCRIPTION OF THE DRAWINGS

FIGS. 1A and 1B are cross-sectional views of the device taken along the lines Ia—Ia and I b—Ib in FIG. 1C, while FIG. 1C is a plan view thereof.

FIGS. 2A and 2B are cross-sectional views of the structure taken along the lines IIa—IIa and IIb—IIb in FIG. 2C, while FIG. 2C is a plan view thereof.

FIGS. 3A and 3B are cross-sectional views of the structure taken along the lines IIIa—IIIa and IIIb—IIIb in FIG. 3C, while FIG. 3C is a plan view thereof.

FIGS. 4A and 4B are cross-sectional views of the structure taken along the lines IVa—IVa and IVb—IVb in FIG. 4C, while FIG. 4C is a plan view thereof.

FIGS. 5A and 5B are cross-sectional views of the structure taken along the lines Va—Va and Vb—Vb in FIG. 5C, while FIG. 5C is a plan view thereof.

FIGS. 6A and 6B are cross-sectional views of the structure taken along the lines VIa—VIa and VIb—VIb in.FIG. 6C, while FIG. 6C is a plan view thereof.

FIGS. 7A and 7B are cross-sectional views of the structure taken along the lines VIIa—VIIa and VIIb—VIIb in FIG. 7C, while FIG. 7C is a plan view thereof.

FIGS. 8A and 8B are cross-sectional views of the structure taken along the lines VIIIa—VIIIa and VIIIb—VIIIb in FIG. 8C, while FIG. 8C is a plan view thereof.

FIGS. 9A and 9B are cross-sectional views of the structure taken along the lines IXa—IXa and IXb—IXb in FIG. 9C, while FIG. 9C is a plan view thereof.

FIGS. 10A and 10B are cross-sectional views of the device taken along the lines Xa—Xa and Xb—Xb in FIG. 10C, while FIG. 10C is a plan view thereof.

FIGS. 11A and 11B are cross-sectional views of the structure taken along the lines XIa—XIa and XIb—XIb in FIG. 11C, while FIG. 11C is a plan view thereof.

FIGS. 12A and 12B are cross-sectional views of the structure taken along the lines XIIa—XIIa and XIIb—XIIb in FIG. 12C, while FIG. 12C is a plan view thereof.

FIGS. 13A and 13B are cross-sectional views of the structure taken along the lines XIIIa—XIIIa and XIIIb—XIIIb in FIG. 13C, while FIG. 13C is a plan view thereof.

FIGS. 14A and 14B are cross-sectional views of the structure taken along the lines XIVa—XIVa and XIVb—XIVb in FIG. 14C, while FIG. 14C is a plan view thereof.

FIGS. 15A and 15B are cross-sectional views of the structure taken along the lines XVa—XVa and XVb—XVb in FIG. 15C, while FIG. 15C is a plan view thereof.

FIGS. 16A and 16B are cross-sectional views of the structure taken along the lines XVIa—XVIa and XVIb—XVIb in FIG. 16C, while FIG. 16C is a plan view thereof.

FIGS. 17A and 17B are cross-sectional views of the structure taken along the lines XVIIa—XVIIa and XVIIb—XVIIb in FIG. 17C, while FIG. 17C is a plan view thereof.

FIGS. 18A and 18B are cross-sectional views of the structure taken along the lines XVIIIa—XVIIIa and XVIIIb—XVIIIb in FIG. 18C, while FIG. 18C is a plan view thereof.

FIG. 24A is a cross-sectional view, taken in the gate length direction, illustrating the sizes of respective parts of the known MIS semiconductor device, while

DESCRIPTION OF THE PREFERRED EMBODIMENTS

Embodiment 1

Figure 1A:
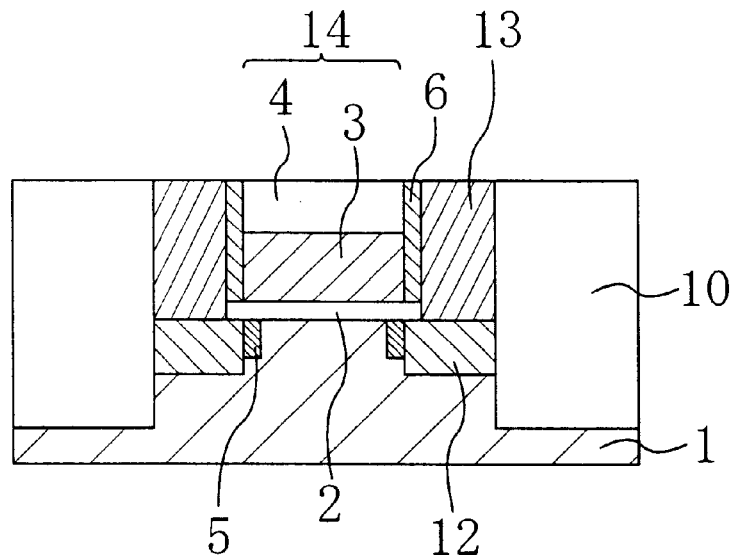
FIGS. 1A through 1C illustrate the structure of a semiconductor device according to a first embodiment of the present invention.
Figure 1B:
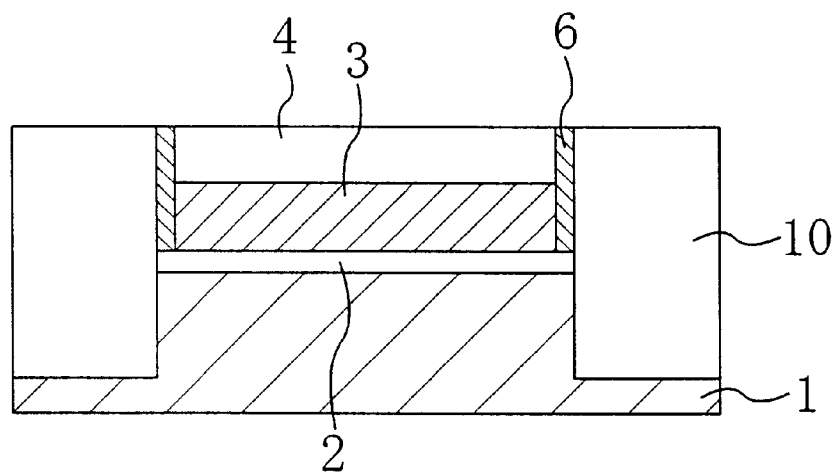
Figure 1C:
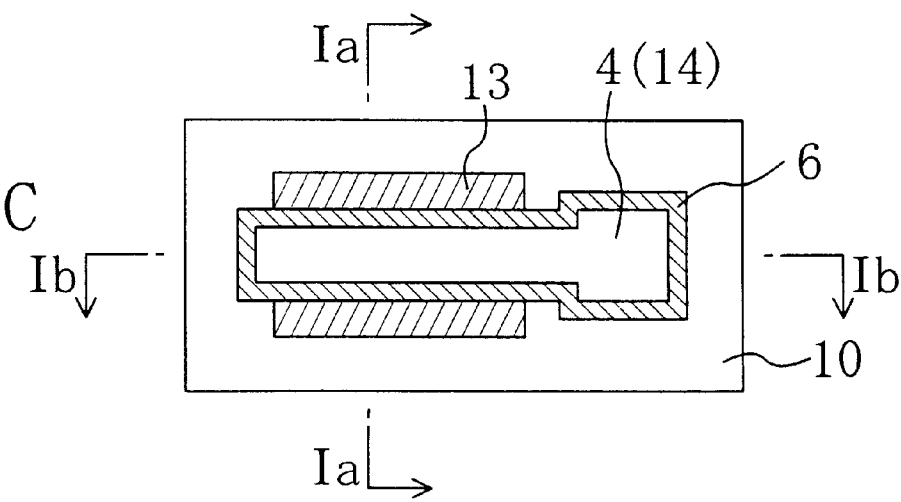

FIGS. 1A through 1C illustrate a semiconductor device according to a first embodiment of the present invention. Specifically, FIG. 1A illustrates a cross section of the device taken in the channel direction (i.e., in the gate length direction). FIG. 1B illustrates a cross section of the device vertically to the channel direction (i.e., in the gate width direction). FIG. 1C is a plan view thereof. FIGS. 1A and 1B are taken along the lines Ia—Ia and Ib—Ib in FIG. 1C, respectively.

A semiconductor device according to the first embodiment may be implemented as an MIS transistor shown in FIG. 1A. The transistor includes Si substrate 1, gate insulating film 2, gate electrode 3, upper insulating film 4, sidewall insulating film 6, LDD regions 5 and heavily doped source/drain regions 12 on the cross section taken in the gate length direction. The gate insulating film 2 is formed out of a silicon dioxide film on the Si substrate 1. The gate electrode 3 is formed on the gate insulating film 2 and may have a poly-metal or polycide structure consisting of a polysilicon film and a low-resistance film. The upper insulating film 4 is stacked on the gate electrode 3 and may be made of silicon nitride. The sidewall insulating film 6, made of silicon nitride, covers the side faces of the gate electrode 3 and upper insulating film 4. And the LDD and heavily doped source/drain regions 5 and 12 are defined within the Si substrate 1. In the following description, the gate electrode 3 and upper insulating film 4 will be collectively called a "gate electrode section" 14. The transistor further includes a trench isolation film 10 and source/drain contacts 13. The isolation film 10 and source/drain contacts 13 are both self-aligned with the gate electrode 3 (or gate electrode section 14). The source/drain contacts 13 are interposed between the sidewall insulating film 6 and isolation film 10 and are located just over the heavily doped source/drain regions 12. And the respective upper surfaces of the upper insulating film 4, isolation film 10, sidewall insulating film 6 and source/drain contacts 13 have all been planarized to almost the same levels.

A retrograde well has also been defined within the Si substrate 1. The lower end of the isolation film 10 is located closely to a deeper region of the retrograde well with a relatively high dopant concentration. That deeper region of the retrograde well functions as a channel stopper region. On the other hand, another region of the retrograde well, which is located under the gate insulating film 2, functions as a channel region. Thus, that region has been doped with a threshold-controlling dopant. In an n-channel MIS transistor, the LDD and heavily doped source/drain regions 5 and 12 are doped with an n-type dopant such as phosphorus or arsenic, while the retrograde well is doped with a p-type dopant such as boron. In a p-channel MIS transistor on the other hand, the LDD and heavily doped source/drain regions 5 and 12 are doped with a p-type dopant such as boron, while the retrograde well is doped with an n-type dopant such as phosphorus or arsenic.

Also, as shown in FIG. 1B, the gate electrode in its entirety 3 is located over the gate insulating film 2. In other words, the gate electrode 3 is electrically isolated from the substrate 1 by way of ONLY the gate insulating film 2. Thus, according to the first embodiment, the gate width is not defined by the isolation film 10 but by the size of the heavily doped source/drain regions 12, which face each other with the gate electrode 3 interposed therebetween, as measured in the gate width direction.

Furthermore, as shown in FIG. 1C, the gate electrode section 14 is surrounded by the sidewall insulating film 6 and part of the sidewall insulating film 6 is surrounded by the isolation film 10. Contact holes were provided between parts of the sidewall insulating film 6, which are located over the heavily doped source/drain regions 12, and the isolation film 10. And the source/drain contacts 13 have been formed by filling in these holes with a conductor.

It should be noted, however, that the sidewall insulating film 6 does not have to be present on the cross section shown in FIG. 1B. That is to say, on the plan view shown in FIG. 1C, the sidewall insulating film 6 may be present only between the gate electrode section 14 and source/drain contacts 13. And the gate electrode section 14 may be in direct contact with the isolation film 10 in the other regions. That is to say, on a transversal cross section taken across a part of the gate electrode 3, a periphery, outlining the gate electrode 3, sidewall insulating film 6 and source/drain contacts 13, is preferably surrounded by the isolation film 10 as shown in FIG. 1C.

Figure 22:
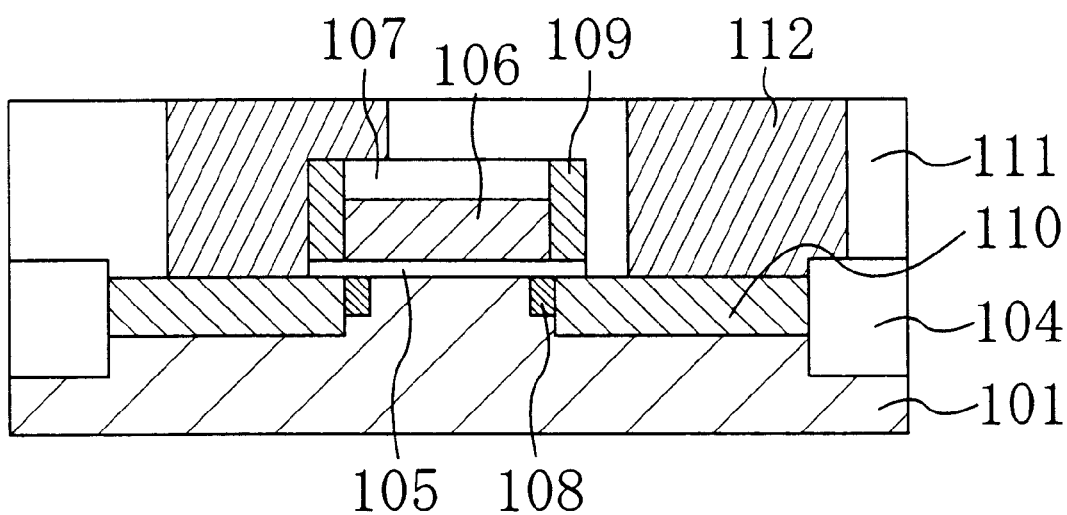
FIG. 22 is a cross-sectional view, taken in the gate length direction, of an MIS semiconductor device including known self-aligned contacts.
Figure 23A:
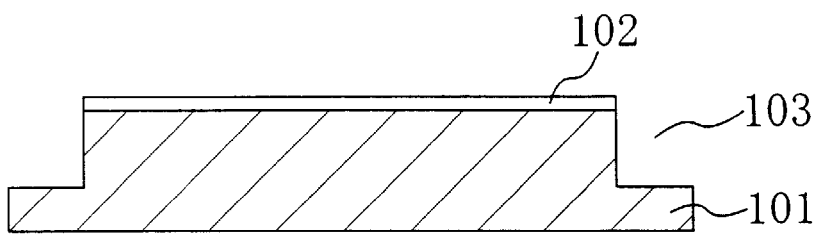
FIGS. 23A through 23E are cross-sectional views, taken in the gate length direction, illustrating respective process steps for fabricating the MIS semiconductor device including the known self-aligned contacts.
Figure 23B:
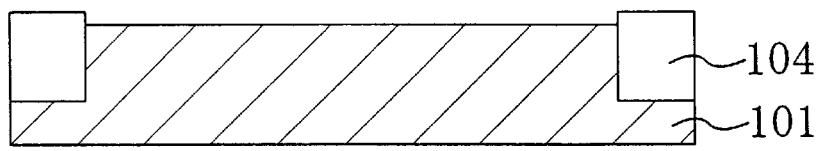
Figure 23C:
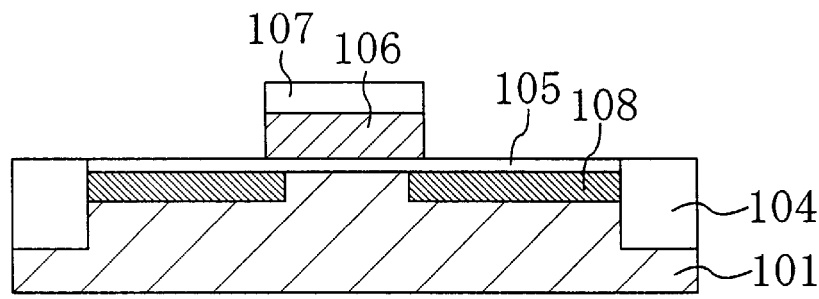
Figure 23D:
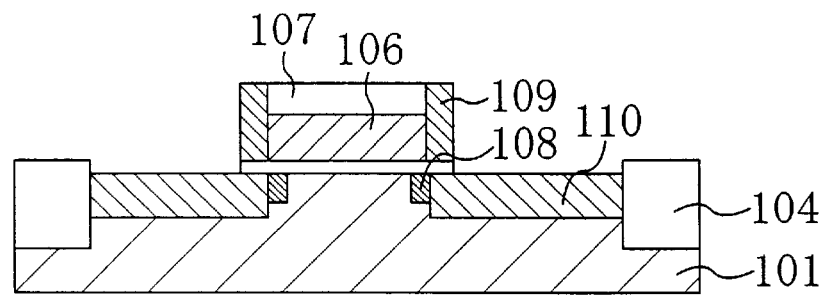
Figure 23E:
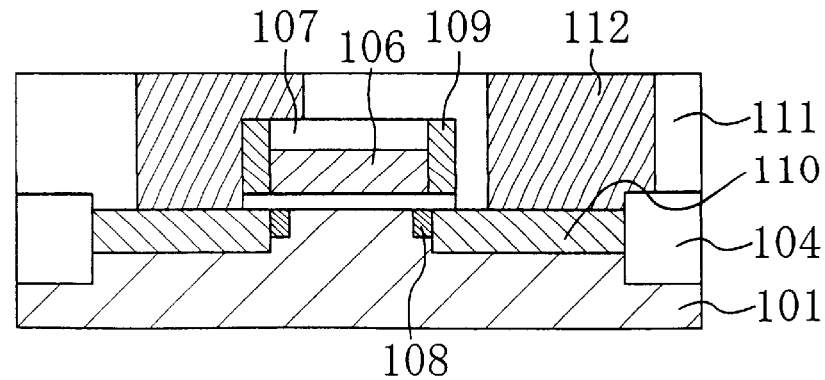

The structure of the semiconductor device according to the first embodiment is characterized in the following respects. Firstly, not only the sidewall insulating film 6 and source/drain contacts 13 but also the isolation film 10 are self-aligned with the gate electrode section 14 (i.e., the gate electrode 3). Secondly, the upper surface of the isolation film 10 is higher than that of the gate electrode 3 and the upper part of the isolation film 10 is adjacent to the source/drain contacts 13. In other words, the upper half of the isolation film 10 functions as the interlevel dielectric film 111 in the known semiconductor device shown in FIG. 22. In addition, not just the sidewall insulating film 6 but the isolation film 10 and source/drain contacts 13 are also formed by a non-exposure technique. Thus, the positional relationship between the isolation film 10 or source/drain contacts 13 and the gate electrode section 14 can be determined in a self-aligned manner. Accordingly, as can be seen from the cross section shown in FIG. 1A, the isolation film 10 is equally spaced apart from the gate electrode section 14 on both sides. And the source/drain contacts 13 of an equal horizontal size are formed on the right- and left-hand sides of the gate electrode section 14 with the sidewall insulating film 6 interposed therebetween. In such a structure, the source/drain contacts 13 can be formed by a non-exposure technique, and their size can be less than the minimum opening size of a resist pattern (or the design rule) for the exposure process. For example, the size of the source/drain contacts 13 as measured in the gate length direction can be arbitrarily defined between 0.01 $\mu$m to 0.1 $\mu$m, which is even smaller than the minimum opening size. In addition, there is no need to assure a mask overlay margin in aligning the gate electrode section 14, isolation film 10 and source/drain contacts 13 with each other. Thus, the sizes of the active region and heavily doped source/drain regions 12 as measured in the gate length direction can also be less than the minimum opening size.

Next, a fabrication process for the semiconductor device of the first embodiment will be described with reference to FIGS. 2A through 9C. FIGS. 2C, 3C, 4C, 5C, 6C, 7C, 8C and 9C are plan views of respective structures prepared to complete the device. FIGS. 2A, 3A, 4A, 5A, 6A, 7A, 8A and 9A illustrate cross sections taken in the gate length direction (i.e., along the lines IIa—IIa, IIIa—IIIa, IVa—IVa, Va—Va, VIa—VIa, VII—VIIa, VIIIa—VIIIa and IXa—XIa shown in FIGS. 2C, 3C, 4C, 5C, 6C, 7C, 8C and 9C, respectively). FIGS. 2B, 3B, 4B, 5B, 6B, 7B, 8B and 9B illustrate cross sections taken in the gate width direction (i.e., along the lines IIb—IIb, IIIb—IIIb, IVb—IVb, Vb—-Vb, VIb—VIb, VIIb—VIIb, VIIIb—VIIIb and IXb—IXb shown in FIGS. 2C, 3C, 4C, 5C, 6C, 7C, 8C and 9C, respectively).

Figure 2A:
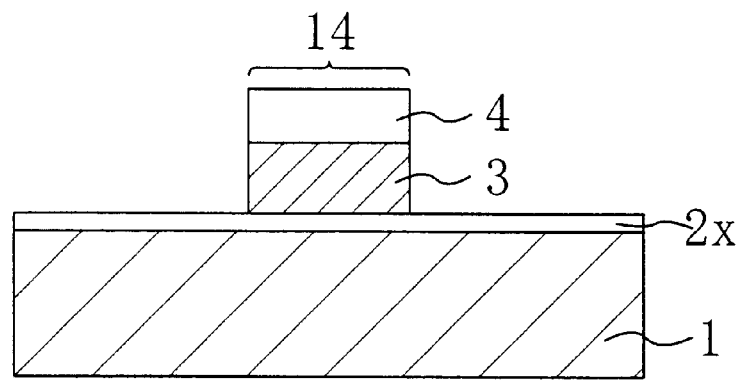
FIGS. 2A through 2C illustrate the step of forming a gate electrode section in a semiconductor device fabrication process according to the first embodiment.
Figure 2B:
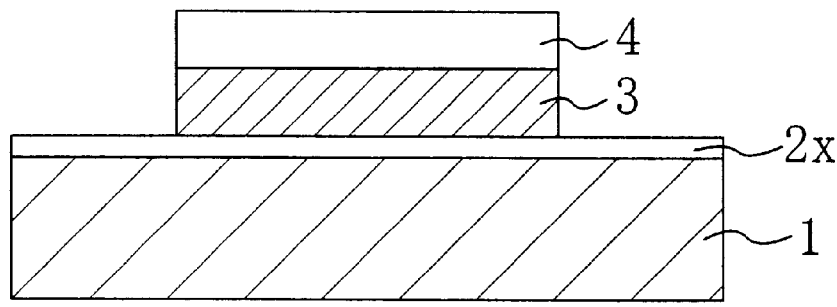
Figure 2C:
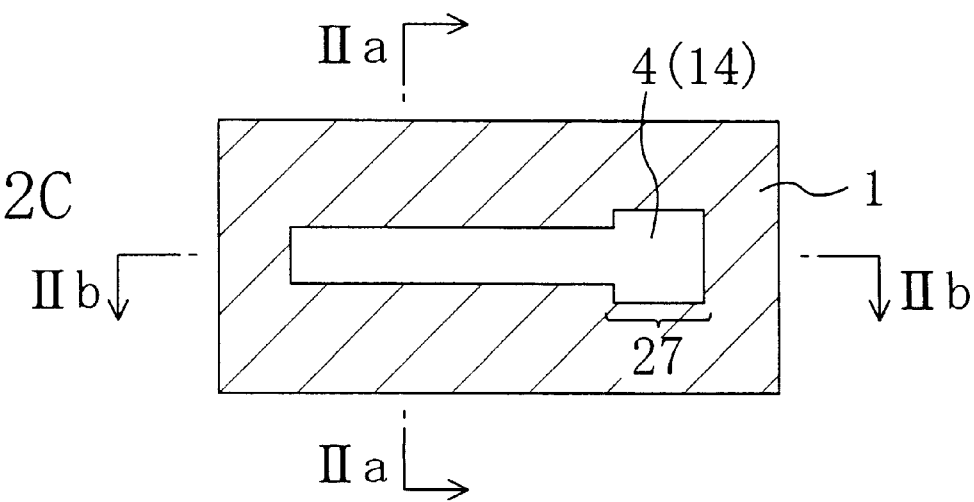

First, in the process step shown in FIGS. 2A through 2C, S a retrograde well is defined within the Si substrate 1 by high-energy ion implantation. And the surface of the substrate 1 is thermally oxidized, thereby forming a silicon dioxide film 2x to a thickness of about 5 nm. Thereafter, a polysilicon film, a low-resistance film consisting of titanium nitride and tungsten films, and a silicon nitride film are deposited in this order on the silicon dioxide film 2x by a CVD process. The polysilicon, titanium nitride, tungsten and silicon nitride films are deposited to respective thicknesses of about 100 nm, about 10 nm, about 90 nm and about 150 nm. Then, a resist pattern (not shown) for gate electrode is defined and these films are dry-etched, thereby patterning the silicon nitride, low-resistance and polysilicon films. In this manner, the silicon nitride film is shaped into the upper insulating film 4 and the low-resistance and polysilicon films are shaped into the gate electrode 3. As a result of this process step, the gate electrode section 14, consisting of the gate electrode 3 and upper insulating film 4, is formed. In this case, a relatively wide portion of the gate electrode 3 will be a gate contact prototype region 27 where a contact will be formed and connected to an upper-level interconnect. The entire gate electrode 3, including the gate contact prototype region 27, is formed on the gate insulating film 2. In this process step, the silicon dioxide film 2x may be patterned so that only its portion under the gate electrode 3 is left as a gate insulating film 2.

Figure 3A:
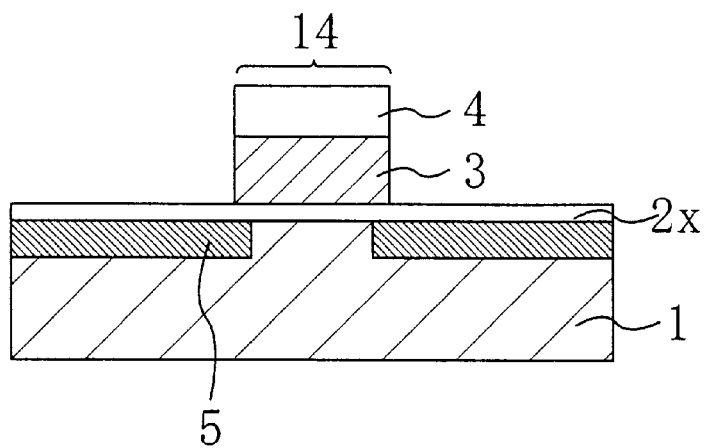
FIGS. 3A through 3C illustrate the step of implanting ions to define LDD regions in the fabrication process of the first embodiment.
Figure 3B:
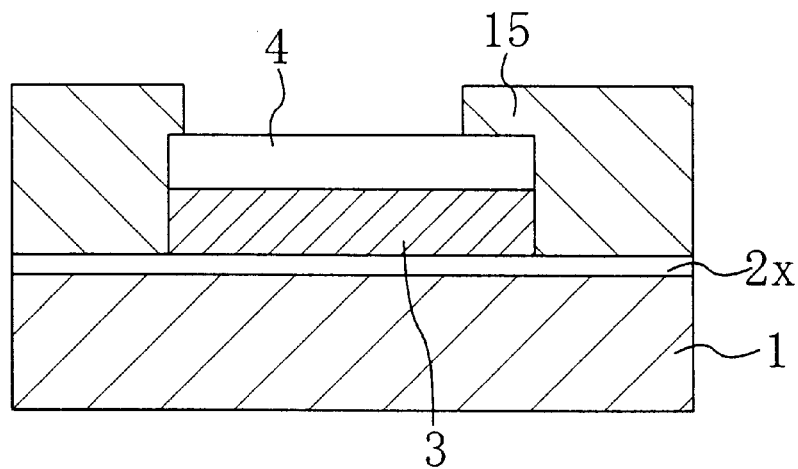
Figure 3C:
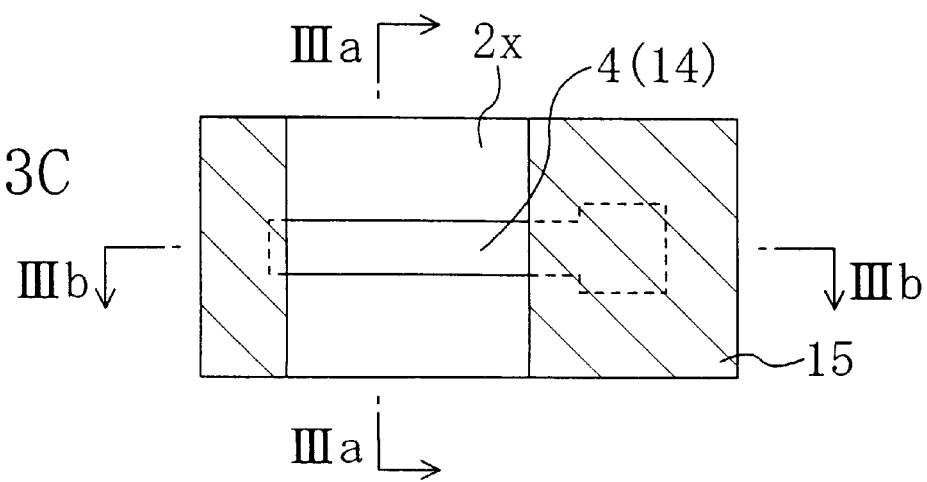

Next, in the process step shown in FIGS. 3A through 3C, a low-concentration dopant is introduced into the substrate 1 by large-angle-tilt ion implantation so that an angle between 20 and 45 degrees is formed with a normal to the substrate surface. In this case, a resist film 15, which has an opening at least over the regions where the source and drain will be defined, and the gate electrode section 14 are used as a mask. In this manner, lightly doped source/drain regions (which will be herein called "LDD regions") 5 are defined to be self-aligned with the gate electrode section 14. If just a portion of the silicon dioxide film 2x is left under the gate electrode 3 in the step shown in FIGS. 2A through 2C, a thin passivation film may be formed to a thickness of about 5 nm on the exposed surface of the substrate before this ion implantation is performed to define the LDD regions 5. In this process step, the LDD regions 5 may be formed not only in the regions to be source/drain regions eventually, but also in the regions where the isolation film will be formed in the gate length direction.

Subsequently, in the process step shown in FIGS. 4A through 4C, after the resist film 15 has been removed, a silicon nitride film and a PSG film are deposited in this order over the substrate to thicknesses of about 20 nm and about 60 nm, respectively. Then, these films are etched back, thereby forming a sidewall insulating film 6 and a sidewall dummy 7 (i.e., the self-aligned sidewall film as defined in the claims) on the side faces of the gate electrode section 14 so that these films are self-aligned with the gate electrode section 14. That is to say, in a plan view, the gate electrode section 14 is surrounded by the sidewall insulating film 6 and sidewall dummy 7 as shown in FIG. 4C. Alternatively, the sidewall insulating film 6 and sidewall dummy 7 may also be formed in the following manner. Specifically, first, only a silicon nitride film may be deposited and etched back to form the sidewall insulating film 6 on the side faces of the gate electrode section 14. Then, after the exposed part of the silicon dioxide film 2x has been removed, a PSG film may be deposited over the substrate and etched back to form the sidewall dummy 7 on the sidewall insulating film 6. The final size of the source/drain contacts as measured in the gate length direction is determined in a self-aligned manner by the size of the sidewall dummy 7. Accordingly, by adjusting the thickness of the PSG film that is deposited to be the sidewall dummy 7, the size of the source/drain contacts is controllable. For example, if the size of the source/drain contacts as measured in the gate length direction should fall within the range from 0.01 $\mu$m to 0.1 $\mu$m, which is smaller than the minimum opening size, the PSG film to be the sidewall dummy 7 should be deposited to a thickness between 10 and 100 nm.

Figure 4A:
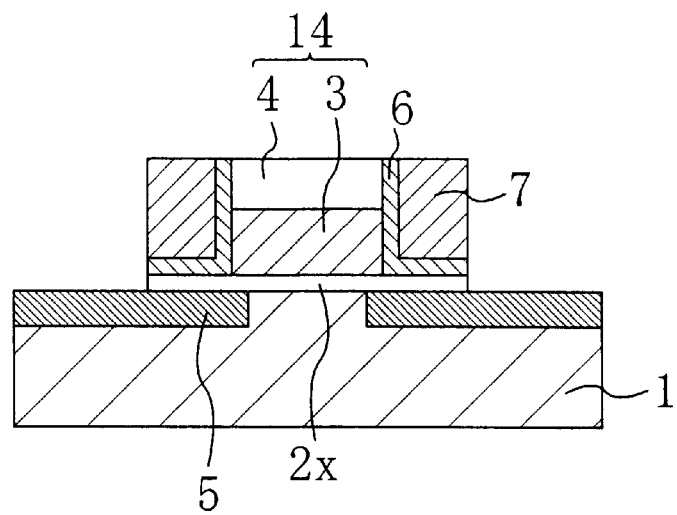
FIGS. 4A through 4C illustrate the step of forming a sidewall insulating film and a sidewall dummy in the fabrication process of the first embodiment.
Figure 4B:
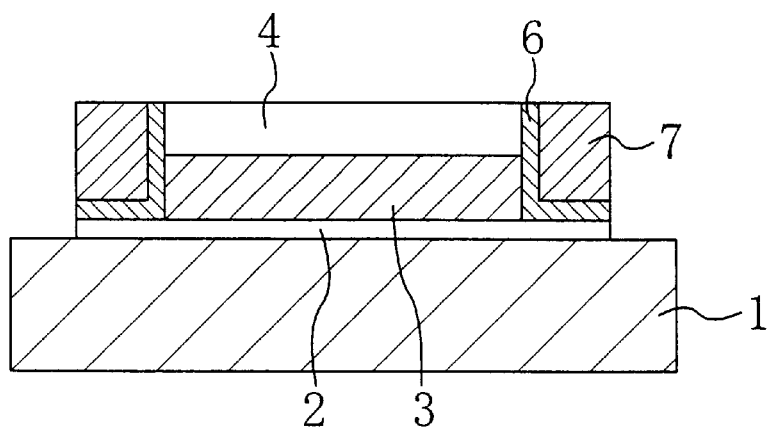
Figure 4C:
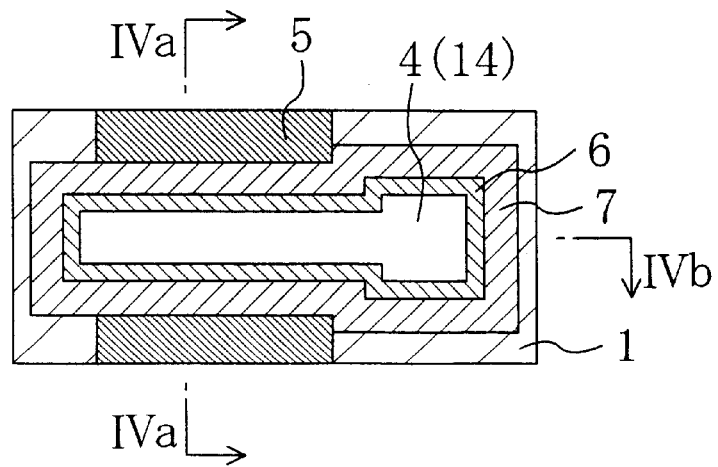
Figure 5A:
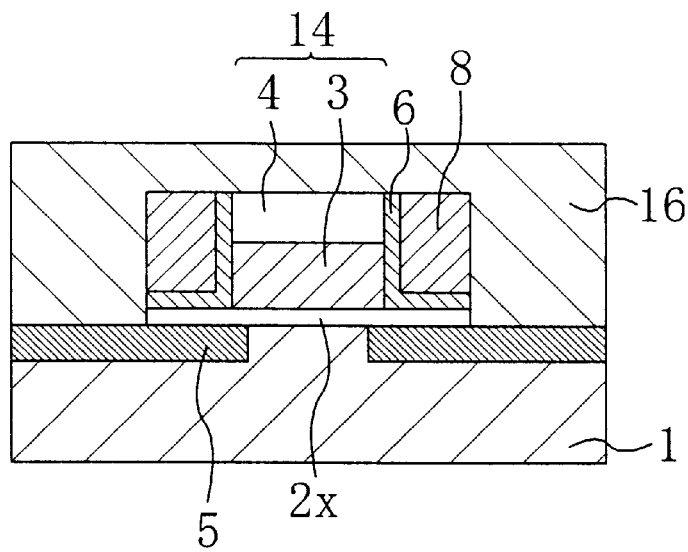
FIGS. 5A through 5C illustrate the step of partially removing the sidewall insulating film and sidewall dummy in the fabrication process of the first embodiment.
Figure 5B:
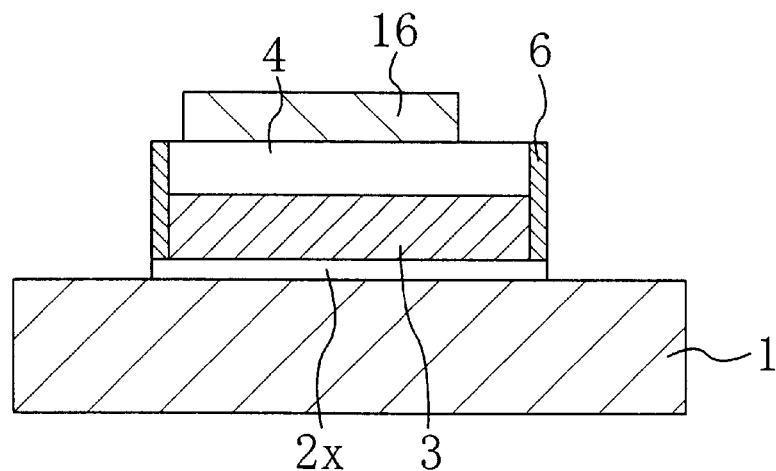
Figure 5C:
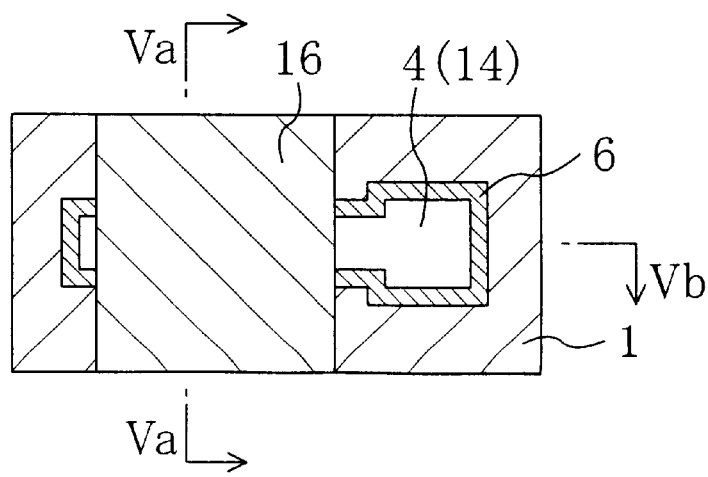

Then, in the process step shown in FIGS. 5A through 5C, a resist film 16 is defined to cover the regions where the source and drain will be formed. Parts of the sidewall dummy 7 are selectively wet-etched away with a selective etchant such as hydrofluoric acid using the resist film 16 as a mask. And exposed parts of the silicon dioxide film 2x and sidewall insulating film 6, which were located under the removed parts of the sidewall dummy 7, are etched away anisotropically. As a result of this process step, parts of the sidewall dummy 7 (which are now contact dummies 8) and part of the silicon dioxide film 2x are left only over the regions where the source and drain will be defined. If the sidewall insulating film 6 and sidewall dummy 7 have been formed separately in the process step shown in FIGS. 4A through 4C, neither the silicon dioxide film 2x nor the sidewall insulating film 6 is left under the sidewall dummy 7. Thus, there is no need to remove them by anisotropic etching. Also, in this process step, parts of the sidewall insulating film 6, which are not covered with the resist film 16, may be all removed.

The resist film 16 should be located over the LDD regions 5 in the gate width direction and should cover at least the gate electrode section 14 and sidewall dummy 7 in the gate length direction.

Figure 6A:
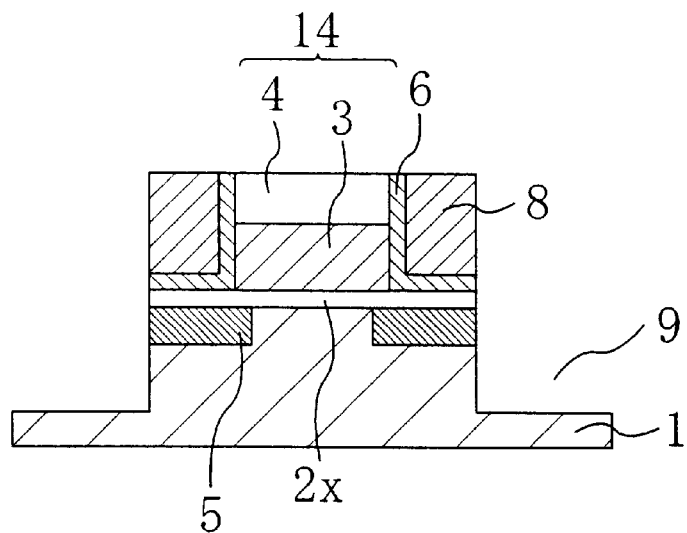
FIGS. 6A through 6C illustrate the step of forming a trench in the fabrication process of the first embodiment.
Figure 6B:
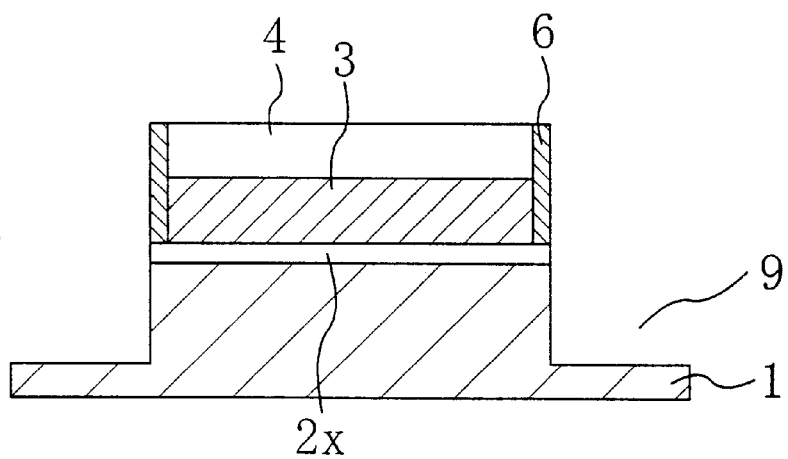
Figure 6C:
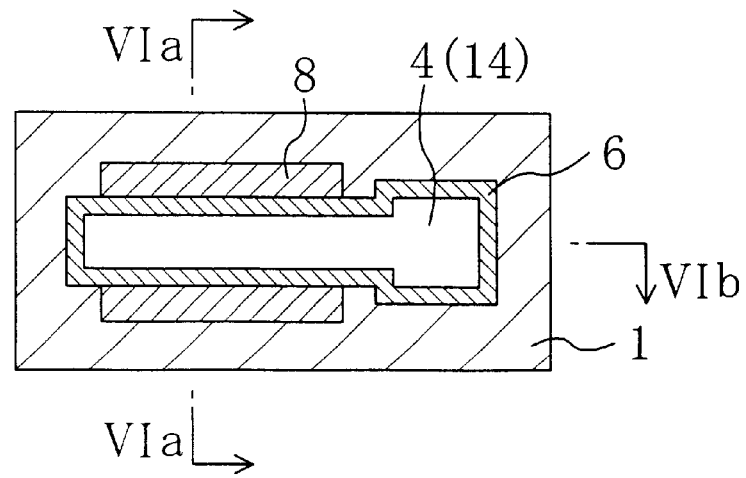

Thereafter, in the process step shown in FIGS. 6A through 6C, the resist film 16 is removed. And the exposed parts of the Si substrate 1 are selectively etched vertically using the upper insulating film 4, sidewall insulating film 6 and contact dummies 8 as a mask. In this manner, a trench 9 is formed to a depth of 0.3 μm, which is deeper than the bottom of heavily doped source/drain regions to be defined later. The upper parts of the trench 9, adjacent to the contact dummies 8, are formed to be self-aligned with the contact dummies 8. And the contact dummies 8 have been self-aligned with the gate electrode section 14 as described above. Accordingly, the lower parts of the trench 9, adjacent to the regions where the source and drain will be defined, are also self-aligned with the gate electrode section 14. The remaining parts of the trench 9 are self-aligned with the gate electrode section 14 with just the sidewall insulating film 6 interposed therebetween. Thus, all of the trench 9 can be self-aligned with the gate electrode section 14.

Figure 7A:
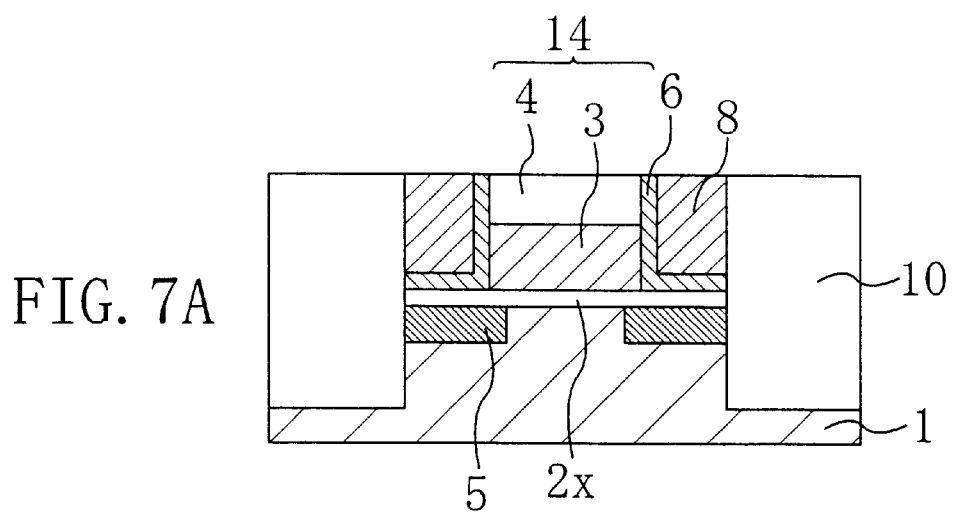
FIGS. 7A through 7C illustrate the step of forming a trench isolation film in the fabrication process of the first embodiment.
Figure 7B:
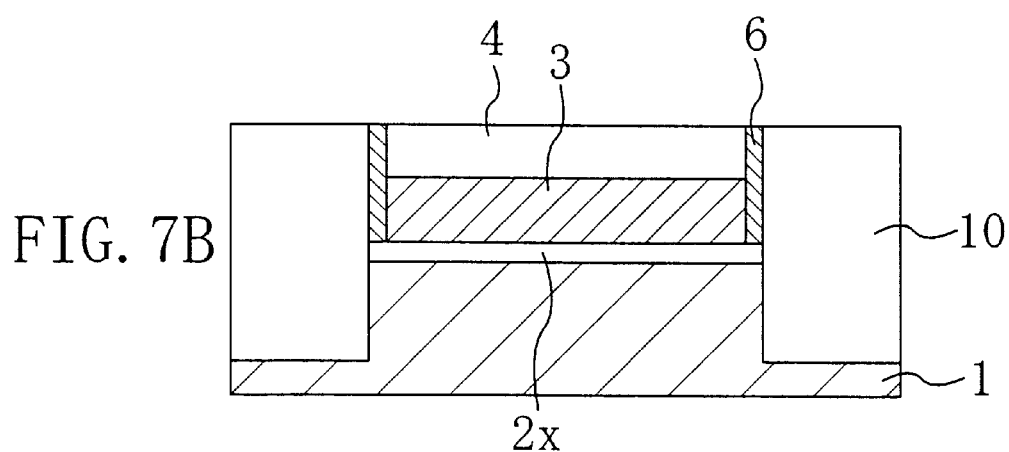
Figure 7C:
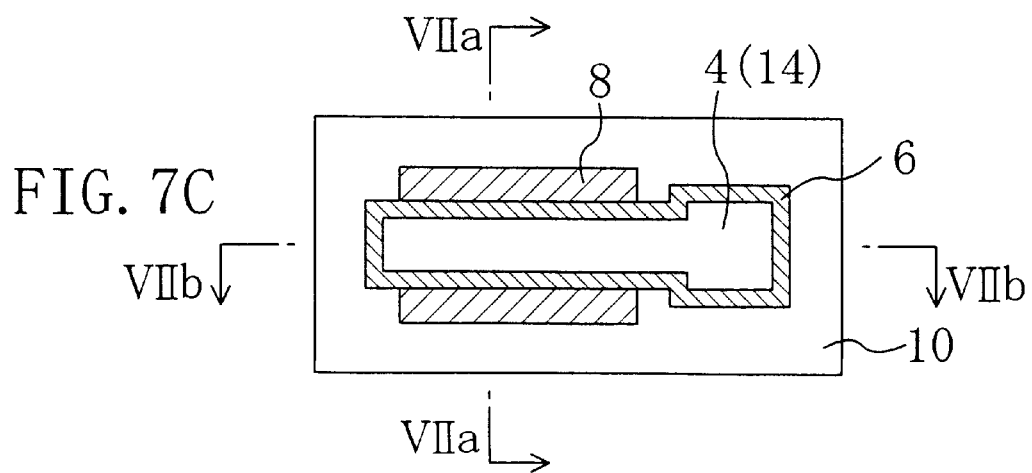

Next, in the process step shown in FIGS. 7A through 7C, a CVD silicon dioxide film is deposited to a thickness of about 1.2 μm over the substrate. Then, the surface of the CVD silicon dioxide film is planarized by a chemical/mechanical polishing (CMP) process until at least the respective surfaces of the upper insulating film 4 and contact dummies 8 are exposed. In this manner, the trench 9 is filled in with the CVD silicon dioxide film, thereby forming the isolation film 10. In this case, the CMP process may be performed until the upper parts of the contact dummies 8 are removed to a certain depth. Alternatively, only the CVD silicon dioxide film may have its upper surface planarized by the CMP process first, and then the surfaces of the upper insulating film 4 and contact dummies 8 may be exposed by etching back the CVD silicon dioxide film.

As a result, the gate electrode section 14 is surrounded by the trench isolation film 10, which has been formed on the Si substrate 1, with the sidewall insulating film 6 and contact dummies 8 interposed therebetween in the regions where the source and drain will be formed. In the other regions, the gate electrode section 14 is surrounded with the isolation film 10 with only the sidewall insulating film 6 interposed between them. In addition, the upper surfaces of the isolation film 10, upper insulating film 4 and contact dummies 8 are planarized to substantially the same levels. Furthermore, the outer ends of the LDD regions 5 in the gate length direction can also be defined definitely by the isolation film 10.

Figure 8A:
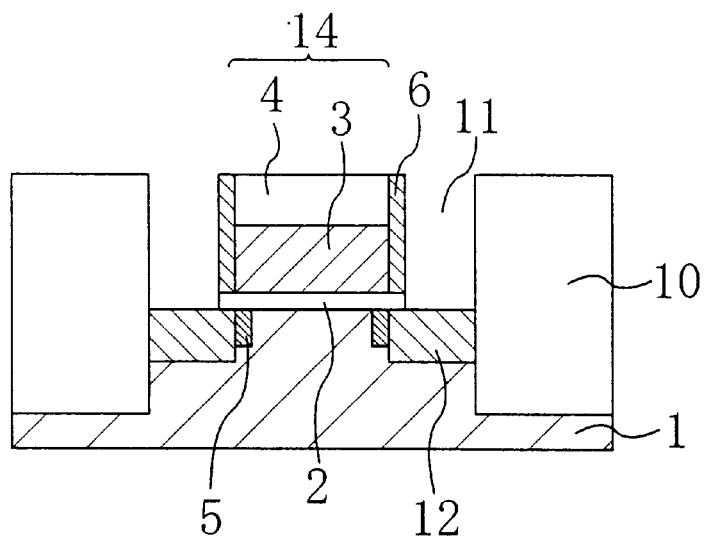
FIGS. 8A through 8C illustrate the step of forming contact holes in the fabrication process of the first embodiment.
Figure 8B:
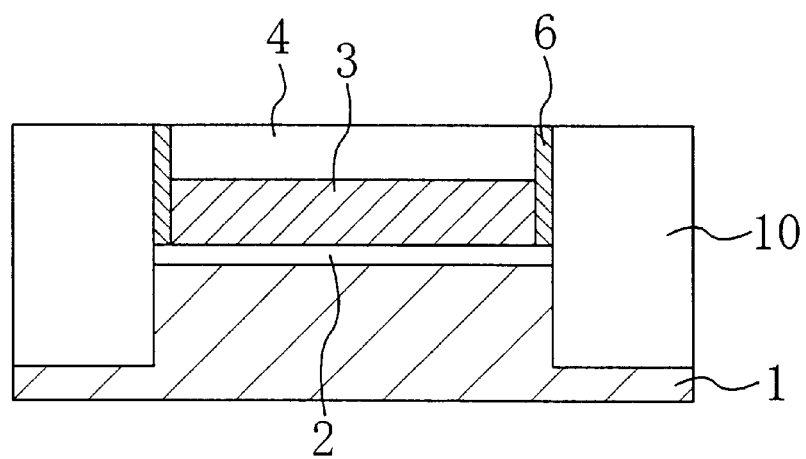
Figure 8C:
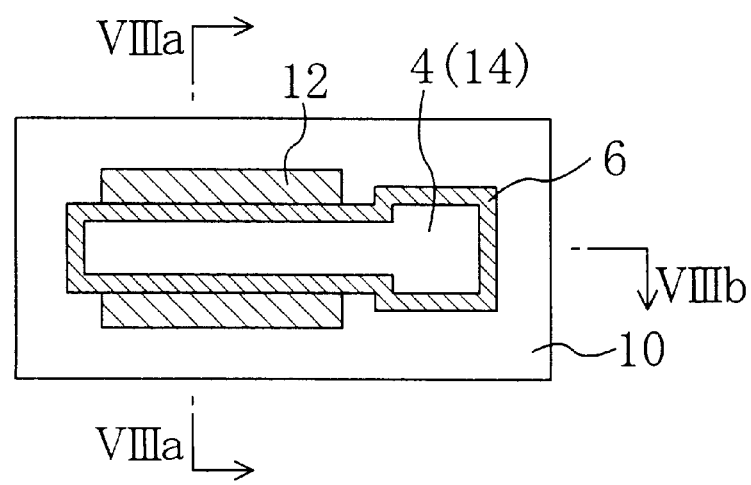

Then, in the process step shown in FIGS. 8A through 8C, the contact dummies 8 are selectively wet-etched away with a selective etchant such as hydrofluoric acid. And parts of the sidewall insulating film 6 and silicon dioxide film 2x, which were located under the removed parts of the contact dummies 8, are etched away anisotropically. In this manner, contact holes 11 are formed to be self-aligned with the gate electrode section 14 (i.e., the gate electrode 3). If the sidewall insulating film 6 and sidewall dummy 7 have been formed separately in the process step shown in FIGS. 4 through 4C, neither the silicon dioxide film 2x nor the side-wall insulating film 6 is left under the contact dummies B. Thus, there is no need to remove them by anisotropic etching. Thereafter, dopant ions are implanted almost vertically and heavily into the Si substrate 1 using the gate electrode section 14, sidewall insulating film 6 and isolation film 10 as a mask, thereby defining the heavily doped source/drain regions 12. In this case, the heavily doped source/drain regions 12 are self-aligned with the gate electrode section 14.

Figure 9A:
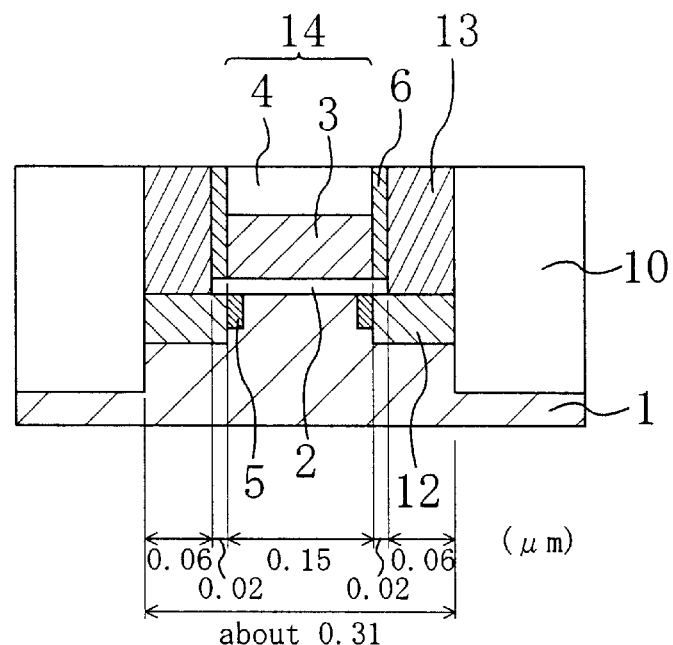
FIGS. 9A through 9C illustrate the step of forming source/drain contacts in the fabrication process of the first embodiment.
Figure 9B:
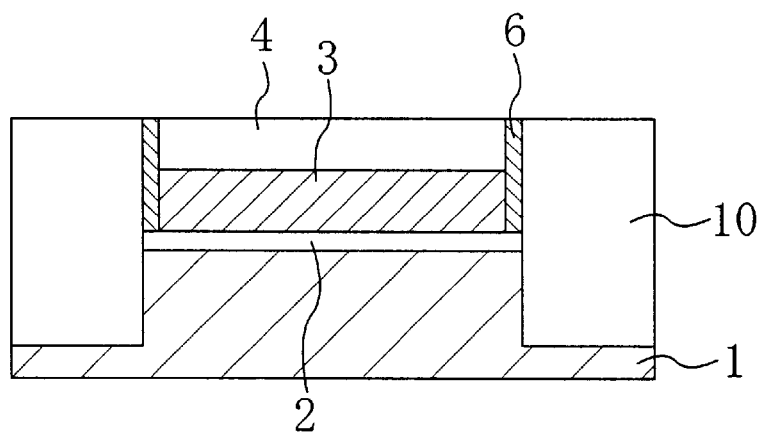
Figure 9C:
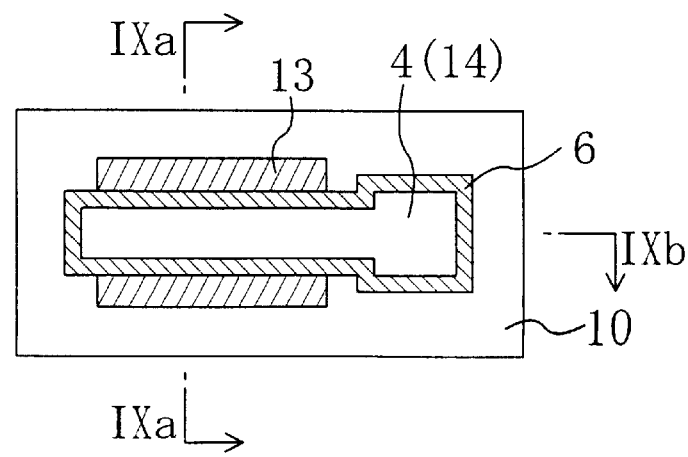

Finally, in the process step shown in FIGS. 9A through 9C, the contact holes 11 are filled in with tungsten, for example, thereby forming the source/drain contacts 13. In this case, the source/drain contacts 13 are self-aligned with the gate electrode section 14 and cover the heavily doped source/drain regions 12 almost entirely. Alternatively, the source/drain contacts 13 may be formed by filling in the holes with a stack of a barrier metal film of Ti and TiN and a metal film of tungsten, aluminum alloy or copper, for example.

In the fabrication process of the first embodiment, the sidewall dummy 7 is formed around, and self-aligned with, the gate electrode section 14 in the process step shown in FIGS. 4A through 4C. Thereafter, in the process steps shown in FIG. 6A through 7C, the trench 9 and trench isolation film 10 are formed to be self-aligned with the contact dummies 8, i.e., parts of the sidewall dummy 7, and with the gate electrode section 14. Subsequently, in the process steps shown in FIGS. 8A through 9C, the contact holes 11, heavily doped source/drain regions 12 and source/drain contacts 13 are formed to be self-aligned with the gate electrode 3 and isolation film 10. That is to say, the LDD regions 5, heavily doped source/drain regions 12, sidewall insulating film 6, isolation film 10 and source/drain contacts 13 can all be self-aligned with the gate electrode section 14.

Accordingly, the source/drain contacts 13 and heavily doped source/drain regions 12 can be formed to a size even smaller than the minimum opening size without being limited by the mask overlay accuracy or minimum opening size. Thus, the size of the active region as measured in the gate length direction can be reduced considerably. When the exemplified fabrication conditions are adopted, the sizes of respective parts of the semiconductor device as measured in the gate length direction will be as shown in FIG. 9A. The gate length of the gate electrode 3 will be 0.15 μm. The size of the sidewall insulating film 6 will be 0.04 μm in total (i.e., 0.02 μm each side). And the size of the source/drain contacts 13 will be 0.12 μm in total (i.e., 0.06 μm each side). Add all of these sizes together, and the size of the entire active region interposed between opposite portions of the isolation film 10 will be about 0.31 μm as measured in the gate length direction. The size of the active region except its portion under the gate electrode 3 with the length of 0.15 μm will be about 0.16 μm in total (i.e., 0.08 μm each side) as measured in the gate length direction.

The semiconductor device according to this embodiment has these sizes. Thus, the device of this embodiment has the following advantages over the prior art device.

Figure 24A:
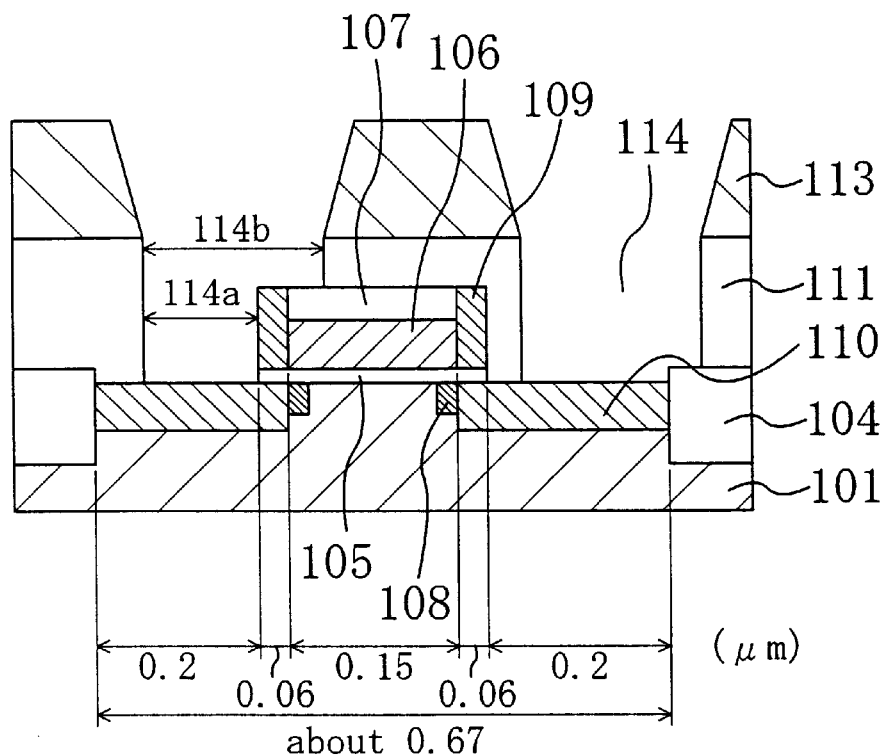
Figure 24B:
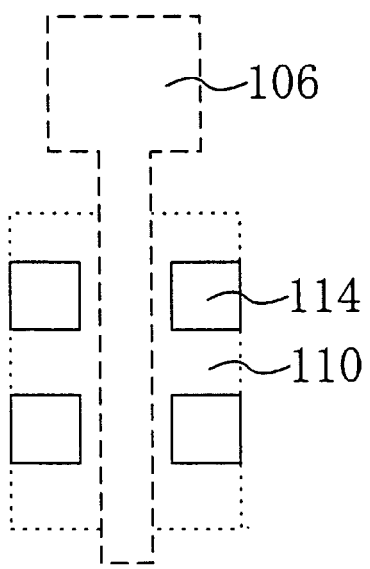
FIG. 24B is a plan view thereof.

First, the size of the entire active region in the inventive device will be compared to that of the prior art device. As shown in FIG. 24A, the size of the entire active region in the gate length direction measures about 0.67 μm in the prior art device. In contrast, the size of the entire active region in the gate length direction can be approximately half, i.e., about 0.31 μm, in the inventive device.

In the prior art device, even if the design rule for a gate electrode, for example, has been reduced, the mask overlay margin does not decrease proportionally. Since it is expected that the design rule will be continuously reduced from now on, the mask overlay margin will constitute an increasingly great obstacle to downsizing of semiconductor devices. In the inventive device, however, the size of the overall active region in the gate length direction can be only about twice larger than the gate length. Thus, the inventive device can be downsized almost in proportion to the reduction in gate length.

Also, in the prior art device shown in FIG. 24A, the size of the active region, except the region under the gate electrode 106, measures about 0.52 μm in the gate length direction. In contrast, the size of that region in the gate length direction can be approximately one-third, i.e., about 0.16 μm, in the inventive device. Thus, according to the present invention, the junction capacitance can be reduced and therefore the MIS transistor can operate at much higher speeds.

In the first embodiment, the sidewall dummy 7 may be made of any material so long as the sidewall dummy 7 can be used as an etching mask in forming the trench 9 in the substrate 1 and is selectively removable with respect to the upper insulating film 4 and isolation film 10. For example, if the upper insulating film 4, sidewall insulating film 6 and isolation film 10 are all made of silicon dioxide, then the sidewall dummy 7 may be made of silicon nitride.

Also, in the first embodiment, the sidewall dummy 7 is formed at the same time with the sidewall insulating film 6, which is provided for electrically isolating the gate electrode 3 from the source/drain contacts 13, in the process step shown in FIGS. 4A through 4C. Alternatively, only the sidewall dummy 7 may be formed in the process step shown in FIGS. 4A through 4C. Then, after the contact holes 11 have been formed in the process step shown in FIGS. 8A through 8C, the sidewall insulating film 6 may be formed on at least the exposed side faces of the upper insulating film 4 and gate electrode 3 inside the contact holes 11. The gate electrode 3 can be electrically isolated from the source/drain contacts 13 even by this method.

Embodiment 2

Figure 10A:
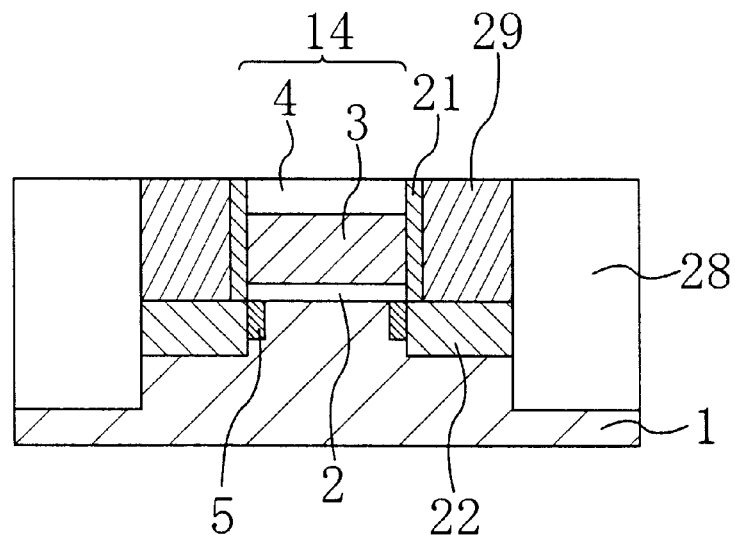
FIGS. 10A through 10C illustrate the structure of a semiconductor device according to a second embodiment of the present invention.
Figure 10B:
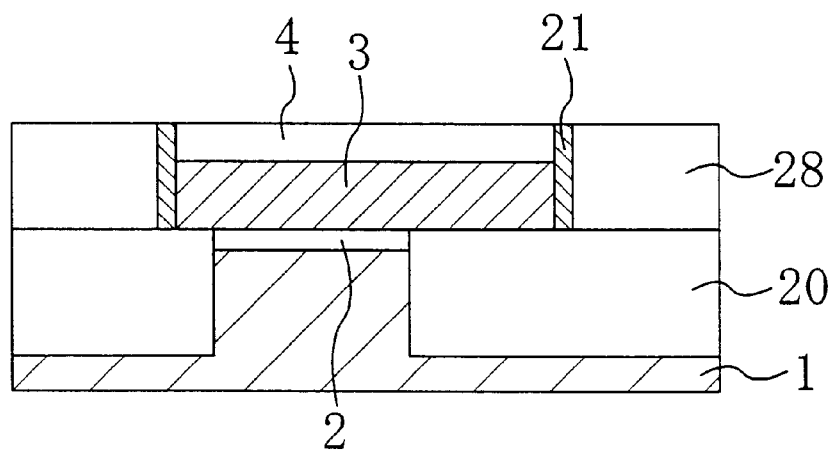
Figure 10C:
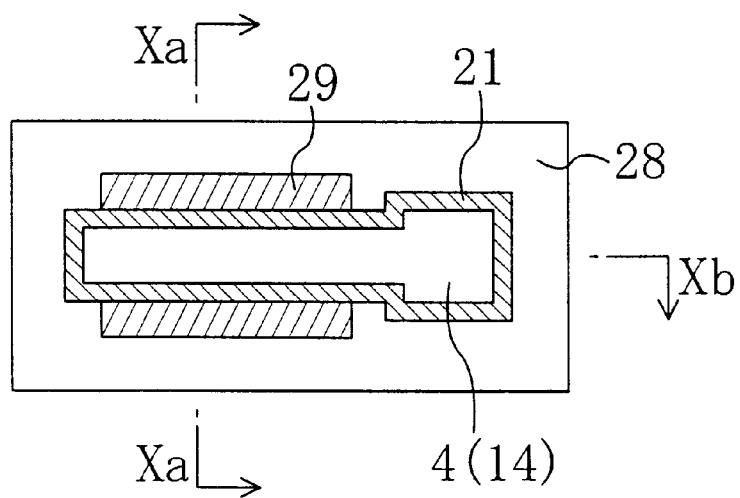

FIGS. 10A through 10C illustrate the structure of a semiconductor device according to a second embodiment of the present invention. Specifically, FIG. 10A illustrates a cross section of the device taken in the channel direction (i.e., in the gate length direction). FIG. 10B illustrates a cross section of the device vertically to the channel direction (i.e., in the gate width direction). And FIG. 10C is a plan view thereof. FIGS. 10A and 10B are taken along the lines Xa—Xa and Xb—Xb shown in FIG. 10C.

As shown in FIG. 10A, an MIS transistor according to the second embodiment has basically the same structure as the counterpart of the first embodiment shown in FIG. 1A when taken in the gate length direction. Specifically, the transistor also includes Si substrate 1, gate insulating film 2, gate electrode 3, upper insulating film 4, sidewall insulating film 21, LDD regions 5 and heavily doped source/drain regions 22 on the cross section taken in the gate length direction. The gate insulating film 2 is also formed out of a silicon dioxide film on the substrate 1. The gate electrode 3 is also formed on the gate insulating film 2 and may also have a poly-metal or polycide structure consisting of a poly-silicon film and a low-resistance film. The upper insulating film 4 is also stacked on the gate electrode 3 and may also be made of silicon nitride. The sidewall insulating film 21, made of silicon nitride, also covers the side faces of the gate electrode 3 and upper insulating film 4. And the LDD and heavily doped source/drain regions 5 and 22 are also defined within the substrate 1. The gate electrode 3 and upper insulating film 4 will also be collectively called a "gate electrode section 14". The transistor further includes a trench isolation film 28 and source/drain contacts 29. The isolation film 28 and source/drain contacts 29 are both self-aligned with the gate electrode 3 (or the gate electrode section 14). The source/drain contacts 29 are interposed between the sidewall insulating film 21 and isolation film 28 and are located just over the heavily doped source/drain regions 22. And the respective upper surfaces of the upper insulating film 4, isolation film 28, sidewall insulating film 21 and source/drain contacts 29 have all been planarized to almost the same levels. A retrograde well, functioning as a channel stopper, for example, has also been defined within the substrate 1 as described for the first embodiment.

In the first embodiment, the gate insulating film 2 is located under the gate electrode 3 and sidewall insulating film 6 as shown in FIG. 1A. In contrast, according to the second embodiment, the gate insulating film 2 is located only under the gate electrode 3 as shown in FIG. 10A. However, the gate insulating film 2 may be defined as in the first embodiment.

As shown in FIG. 10B, the device of the second embodiment is different from the device of the first embodiment shown in FIG. 1B in that the former device includes a gate-width-defining trench isolation film 20 for defining the width of the gate electrode 3. The depth of the isolation film 20 may be 0.3 μm, for example.

Furthermore, as shown in FIG. 10C, the gate electrode section 14 is surrounded by the sidewall insulating film 21 and part of the sidewall insulating film 21 is surrounded by the trench isolation film 28. Contact holes are provided between parts of the sidewall insulating film 21, which are located over the heavily doped source/drain regions 22, and the isolation film 28. And the contact holes are filled in with the source/drain contacts 29. It should be noted, however, that the sidewall insulating film 21 does not have to be present on the cross section shown in FIG. 10B. That is to say, on the plan view shown in FIG. 10C, the sidewall insulating film 21 may be present only between the gate electrode section 14 and source/drain contacts 29 and the gate electrode section 14 may be in direct contact with the isolation film 28 in the other regions. Nevertheless, on a transversal cross section taken across a part of the gate electrode 3, a periphery, outlining the gate electrode 3, sidewall insulating film 21 and source/drain contacts 29, is preferably surrounded by the isolation film 28 as shown in FIG. 10C.

The device of the second embodiment has the same features as the counterpart of the first embodiment. Specifically, not only the sidewall insulating film 21 and source/drain contacts 29 but also the isolation film 28 are self-aligned with the gate electrode section 14 as well. The upper surface of the isolation film 28 is higher than that of the substrate 1 and the upper part of the isolation film 28 is adjacent to the source/drain contacts 29. In other words, the upper half of the isolation film 28 functions as the inter-level dielectric film 111 in the known device shown in FIG. 22. In addition, the device of the second embodiment is also characterized in that the active region is sandwiched by the isolation film 28 in the gate length direction and by the gate-width-defining trench isolation film 20 in the gate width direction. As a result, the variation in electrical characteristics of the semiconductor device can be reduced as will be described later.

Hereinafter, a fabrication process for the semiconductor device of the second embodiment will be described with reference to FIGS. 11A through 18C. FIGS. 11C, 12C, 13C, 14C, 15C, 16C, 17C and 18C are plan views of respective structures prepared to complete the device. FIGS. 11A, 12A, 13A, 14A, 15A, 16A, 17A and 18A illustrate cross sections taken in the gate length direction (i.e., along the lines XIa—XIa, XIIa—XIIa, XIIIa—XIIIa, XIVa—XIV a, XVa—XVa, XVIa—XVIa, XVIIa—XVIIa and XVIIa—XVIIa shown in FIGS. 11C, 12C, 13C, 14C, 15C, 16C, 17C and 18C, respectively). FIGS. 11B, 12B, 13B, 14B, 15B, 16B, 17B and 18B illustrate cross sections taken in the gate width direction (i.e., along the lines XIb—XI b, XIIb—XII b, XIIIb—X IIIb, XIVb—XIVb, XVb—XVb, XVIb—XVIb, XVIIb—XVIIb and XIIIb—-XVIIb shown in FIGS. 11C, 12C, 13C, 14C, 15C, 16C, 17C and 18C, respectively).

Figure 11A:
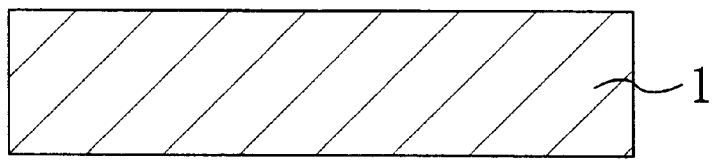
FIGS. 11A through 11C illustrate the step of forming a gate-width-defining trench isolation film in a semiconductor device fabrication process according to the second embodiment.
Figure 11B:
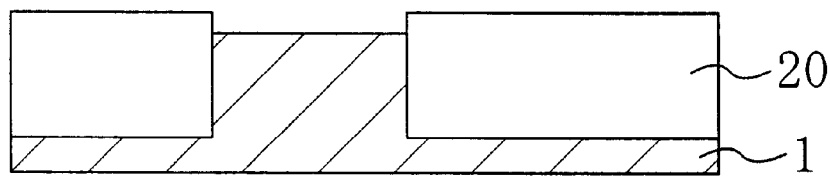
Figure 11C:
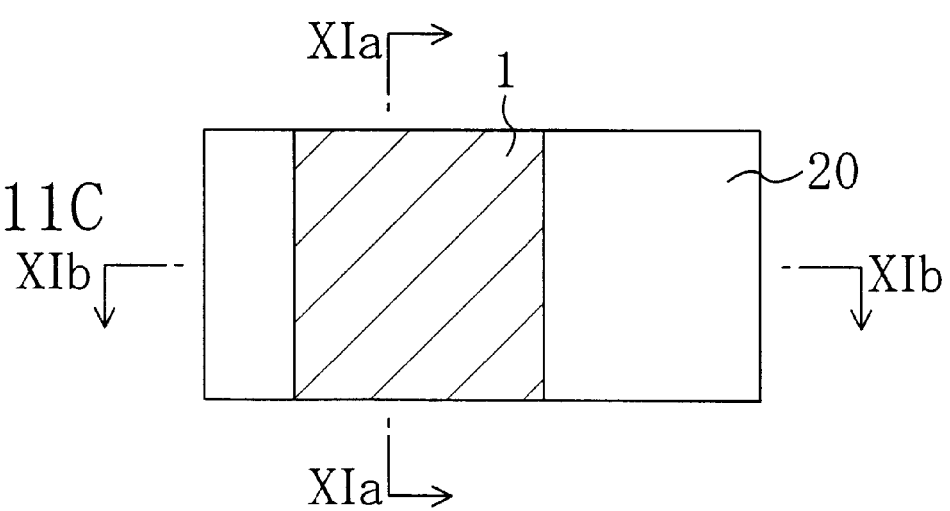

First, in the process step shown in FIGS. 11A through 11C, a retrograde well is defined within the Si substrate 1 by high-energy ion implantation. Then, a gate-width-defining trench isolation film 20 is formed to a depth of 0.3 μm in the substrate 1 to define the size of the active region in the gate width direction.

Figure 12A:
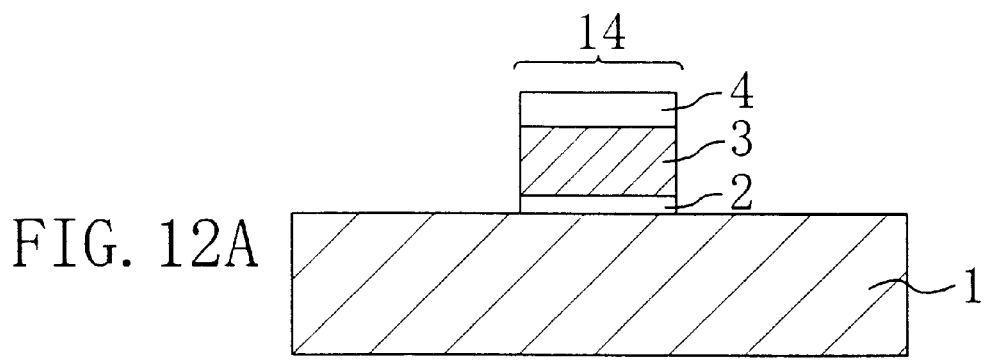
FIGS. 12A through 12C illustrate the step of forming a gate electrode section in the fabrication process of the second embodiment.
Figure 12B:
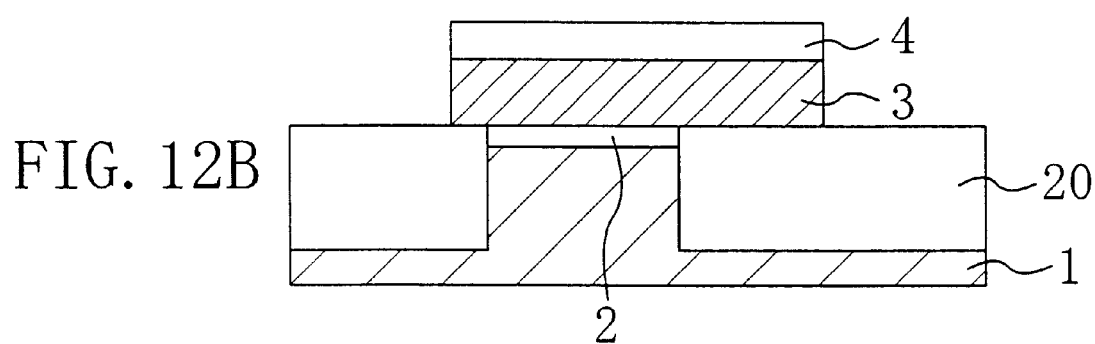
Figure 12C:
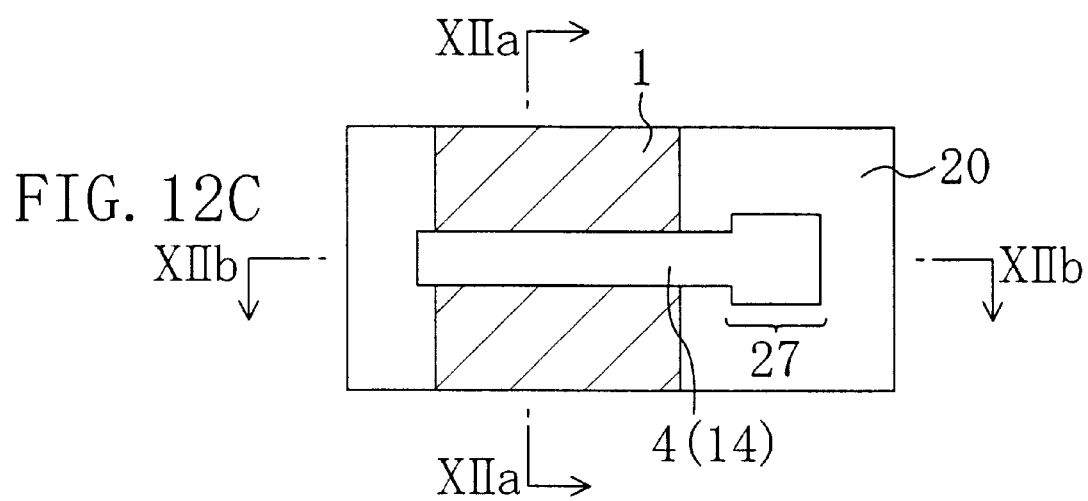

Next, in the process step shown in FIGS. 12A through 12C, the exposed surface of the substrate 1 is thermally oxidized, thereby forming a silicon dioxide film to a thickness of about 5 nm. Thereafter, a polysilicon film, a low-resistance film consisting of titanium nitride and tungsten films with thicknesses of about 10 nm and about 90 nm, respectively, and a silicon nitride film are deposited by a CVD process in this order on the silicon dioxide film. The polysilicon, low-resistance and silicon nitride films are deposited to respective thicknesses of about 100 nm, about 100 nm and about 150 nm. Then, a resist pattern (not shown) for gate electrode is defined and these films are dry-etched, thereby patterning the silicon nitride, low-resistance and polysilicon films. In this manner, the silicon nitride film is shaped into the upper insulating film 4 and the low-resistance and polysilicon films are shaped into the gate electrode 3. In this embodiment, the silicon dioxide film is used as the gate insulating film 2 as it is. As a result of this process step, the gate electrode section 14, consisting of the gate electrode 3 and upper insulating film 4, is formed. In this case, a relatively wide portion of the gate electrode 3 will be a gate contact prototype region 27 where a contact will be formed and connected to an upper level interconnect. In the gate width direction, both ends of the gate electrode section 14, including the gate contact prototype region 27, are located on the gate-width-defining trench isolation film 20.

Figure 13A:
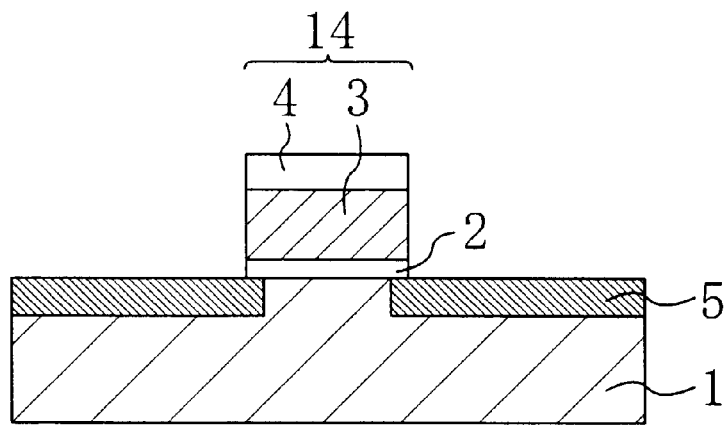
FIGS. 13A through 13C illustrate the step of defining LDD regions in the fabrication process of the second embodiment.
Figure 13B:
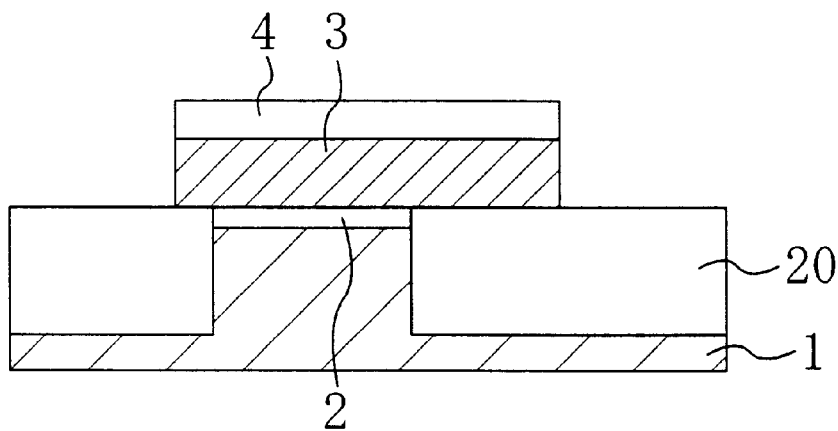
Figure 13C:
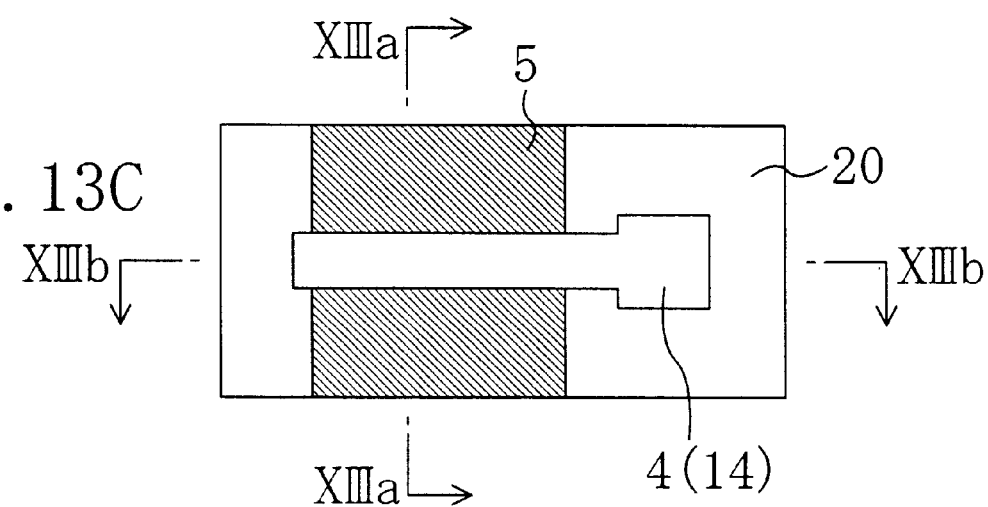

Next, in the process step shown in FIGS. 13A through 13C, dopant ions are lightly implanted into the Si substrate 1 by large-angle-tilt ion implantation so that an angle between 20 and 45 degrees is formed with respect to a normal to the substrate surface. In this case, the gate-width-defining trench isolation film 20 and upper insulating film 4 are used as a mask. In this manner, the LDD regions 5 are defined to be self-aligned with the gate electrode section 14. A thin passivation film may be formed to a thickness of about 5 nm on the exposed surface of the substrate 1 before the ion implantation is carried out to define the LDD regions 5. In this process step, the LDD regions 5 may be formed not only in the regions to be source/drain regions at last, but also in the regions where the isolation film will be formed in the gate length direction.

Figure 14A:
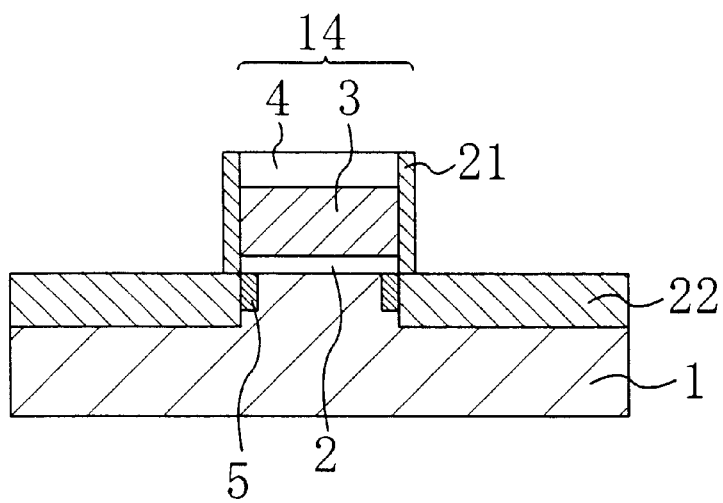
FIGS. 14A through 14C illustrate the step of defining heavily doped source/drain regions in the fabrication process of the second embodiment.
Figure 14B:
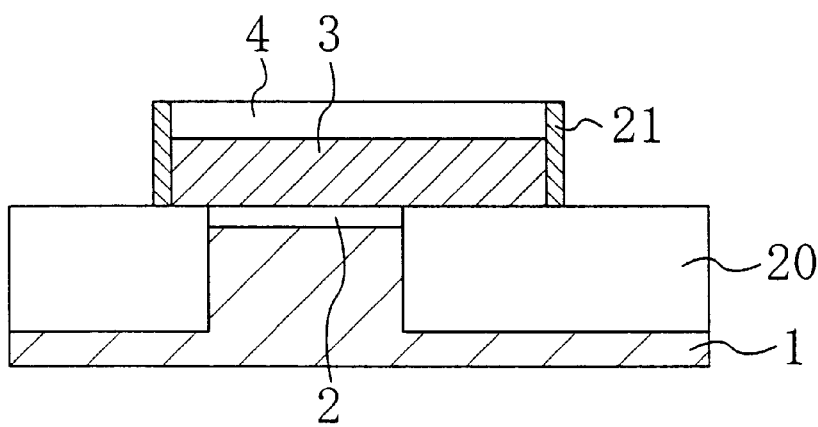
Figure 14C:
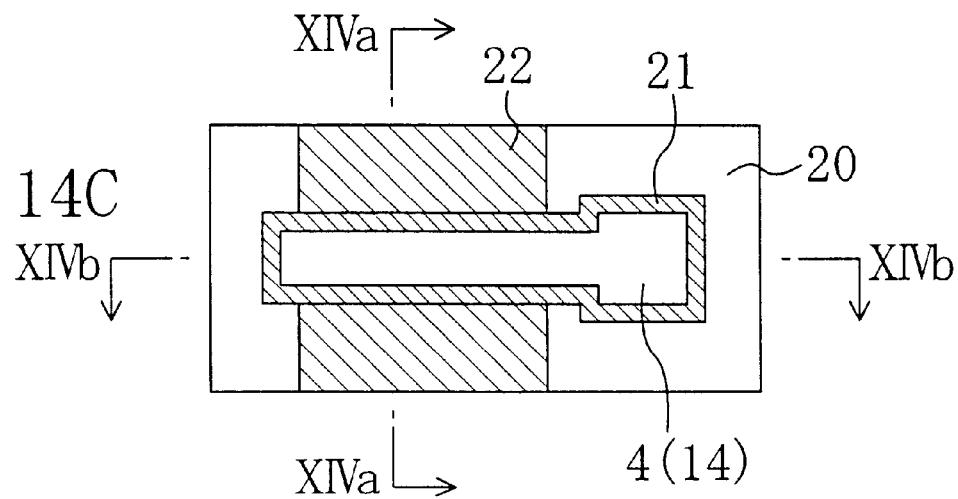

Subsequently, in the process step shown in FIGS. 14A through 14C, a silicon nitride film is deposited over the substrate to a thickness of about 20 nm and then etched back, thereby forming a sidewall insulating film 21 on the side faces of the gate electrode section 14. Thereafter, dopant ions are implanted almost vertically and heavily into the Si substrate 1 using the upper insulating film 4, sidewall insulating film 21 and gate-width-defining trench isolation film 20 as a mask, thereby defining the heavily doped source/drain regions 22. In this case, the heavily doped source/drain regions 22 are self-aligned with the gate electrode section 14.

Figure 15A:
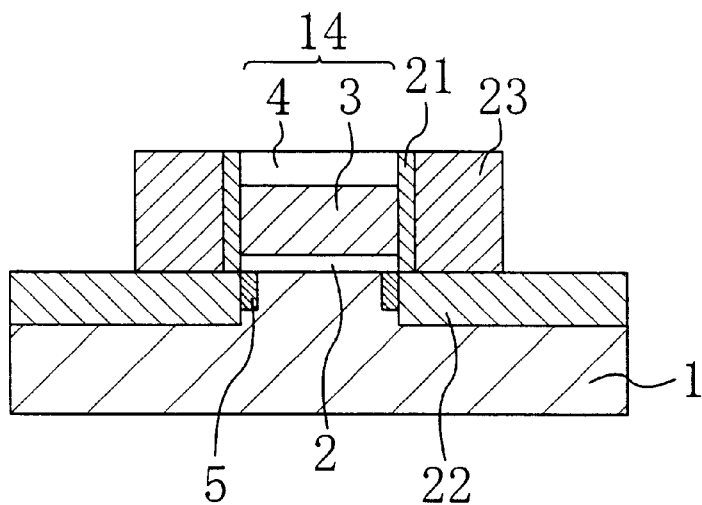
FIGS. 15A through 15C illustrate the step of forming a sidewall conductor film in the fabrication process of the second embodiment.
Figure 15B:
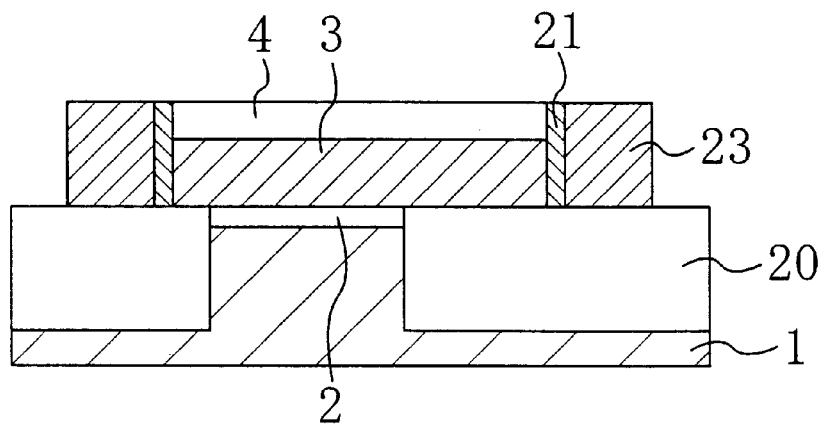
Figure 15C:
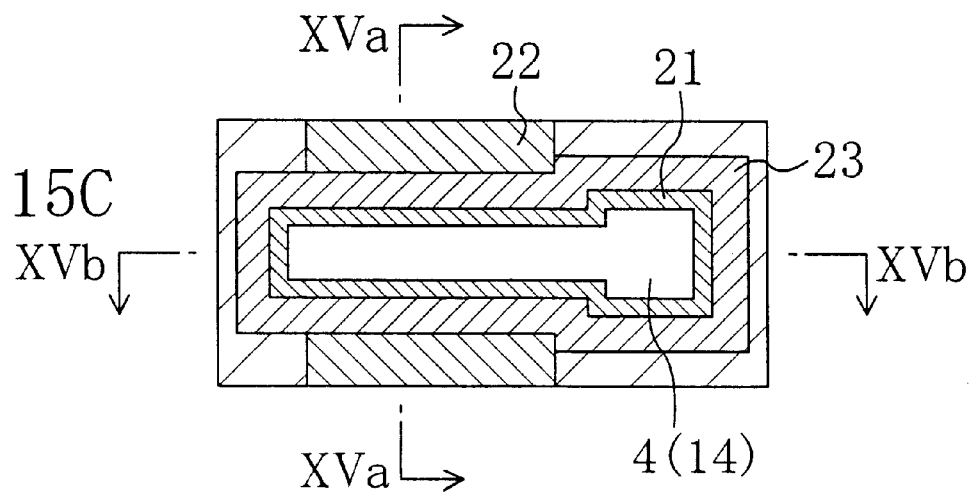

Then, in the process step shown in FIGS. 15A through 15C, a tungsten film is deposited over the substrate to a thickness of about 60 nm and then etched back, thereby forming a sidewall conductor film 23 on the sidewall insulating film 21. In this case, the sidewall conductor film 23 is self-aligned with the gate electrode section 14. The sidewall conductor film 23 is an exemplary self-aligned sidewall film as defined in the claims. According to this embodiment, this sidewall conductor film 23 will be source/drain contacts in the end. Thus, by adjusting the thickness of the sidewall conductor film (i.e., the tungsten film) 23, the size of the source/drain contacts is controllable directly. For example, if the size of the source/drain contacts as measured in the gate length direction should fall within the range from 0.01 μm to 0.1 μm, which is smaller than the minimum opening size, the sidewall conductor film 23 of tungsten should be deposited to a thickness between 10 nm and 100 nm.

Figure 16A:
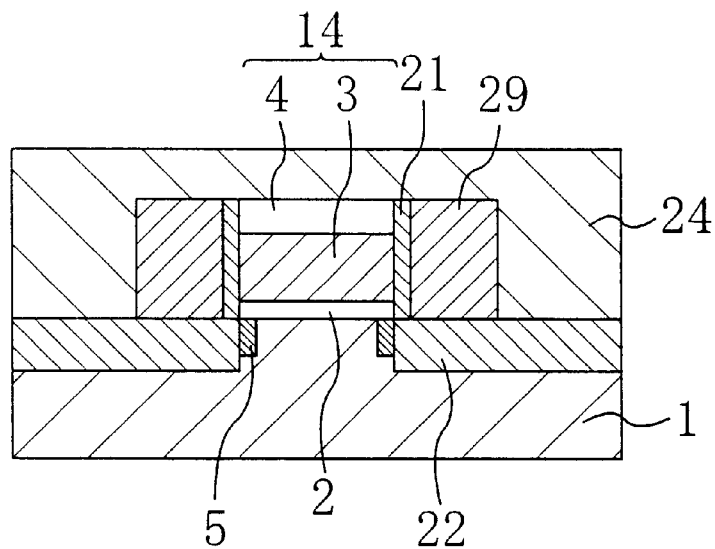
FIGS. 16A through 16C illustrate the step of partially removing the sidewall conductor film in the fabrication process of the second embodiment.
Figure 16B:
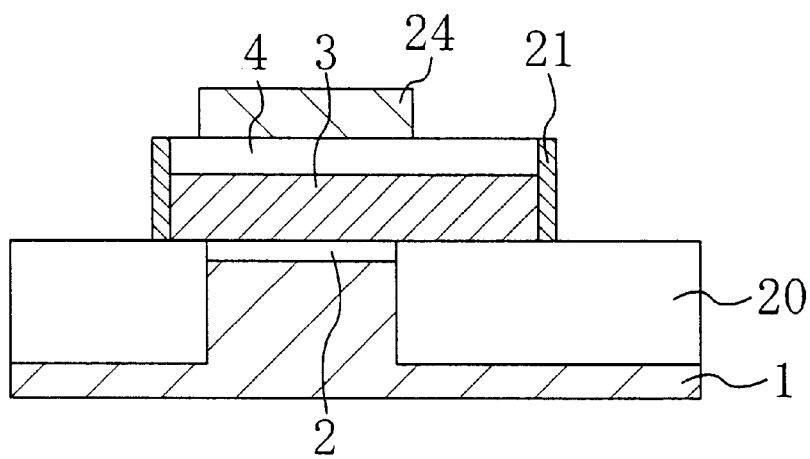
Figure 16C:
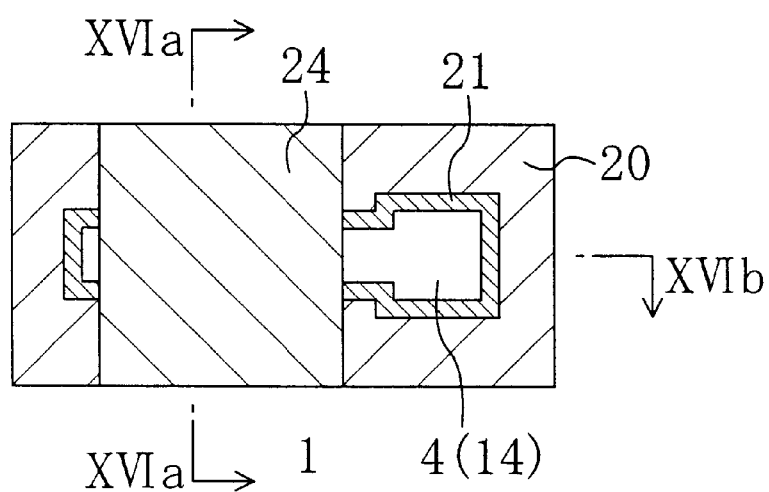

Then, in the process step shown in FIGS. 16A through 16C, a resist film 24 is defined to cover the regions where the source and drain will be formed. Part of the sidewall conductor film 23 is selectively etched away using the resist film 24 as a mask. In this manner, only those parts of the sidewall conductor film 23, which are located over the regions where the source and drain will be formed, are left, thereby forming the source/drain contacts 29. In this process step, parts of the sidewall insulating film 21, which are not covered with the resist film 24, may be all removed. The resist film 24 should be located over the heavily doped source/drain regions 22 in the gate width direction and should cover at least the gate electrode section 14 and sidewall conductor film 23 in the gate length direction.

Figure 17A:
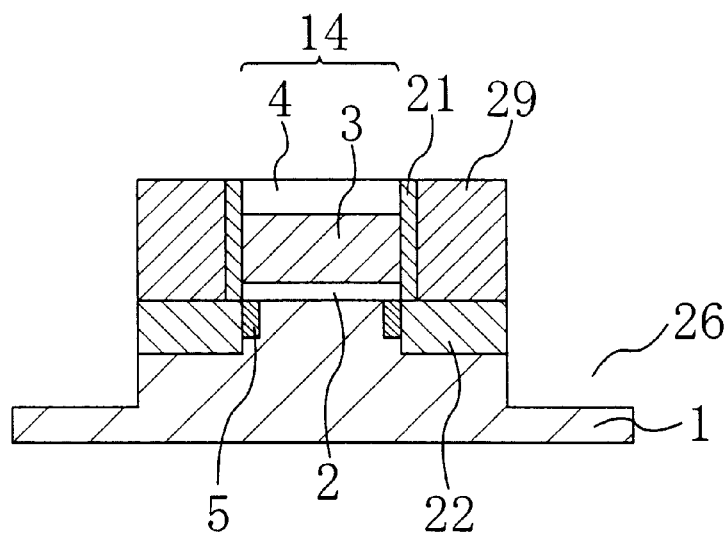
FIGS. 17A through 17C illustrate the step of forming a trench in the fabrication process of the second embodiment.
Figure 17B:
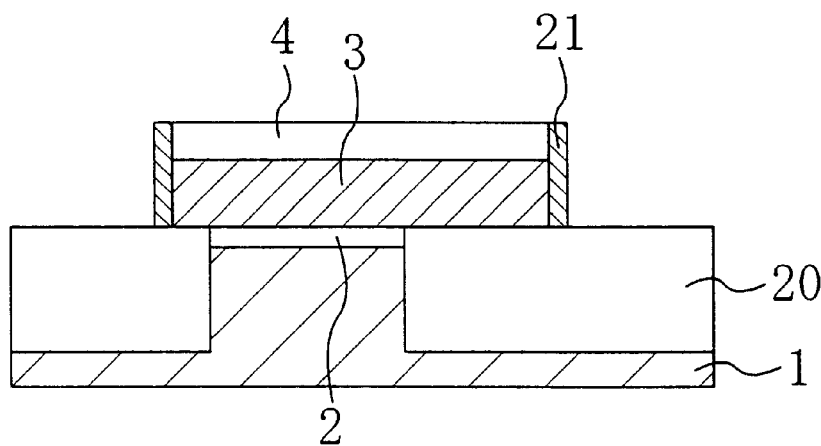
Figure 17C:
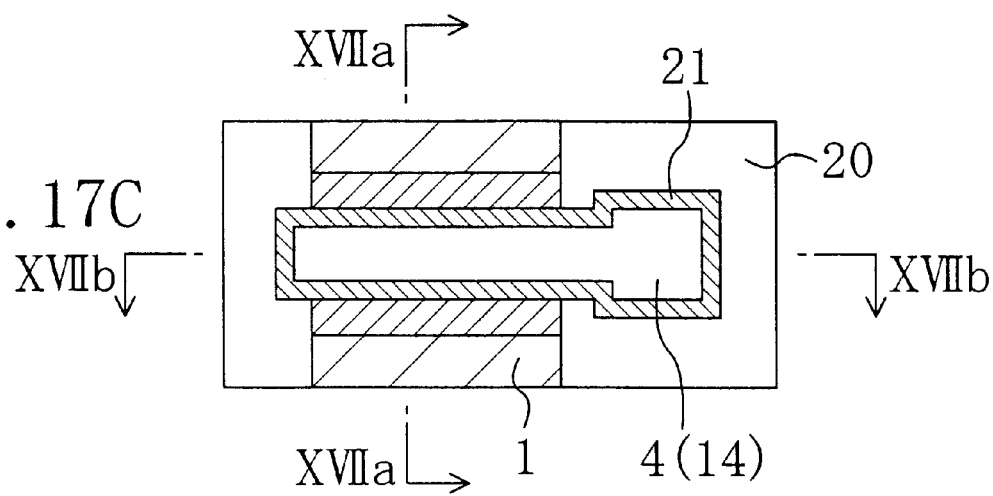

Thereafter, in the process step shown in FIGS. 17A through 17C, the resist film 24 is removed. And the exposed parts of the Si substrate 1 are selectively etched vertically using the upper insulating film 4, sidewall insulating film 21, gate-width-defining trench isolation film 20 and source/drain contacts 29 as a mask. In this manner, trenches 26 are formed to a depth of 0.3 μm, which is deeper than the bottom of the heavily doped source/drain regions 22. The trenches 26 are formed to be self-aligned with the source/drain contacts 29. And the source/drain contacts 29 have been self-aligned with the gate electrode section 14 as described above. Accordingly, the trenches 26 are also self-aligned with the gate electrode section 14. Optionally, the surfaces of the source/drain contacts 29 may be covered with a passivation film either by selectively oxidizing those surfaces or by forming insulating sidewalls thereon before the trenches 26 are defined.

Figure 18A:
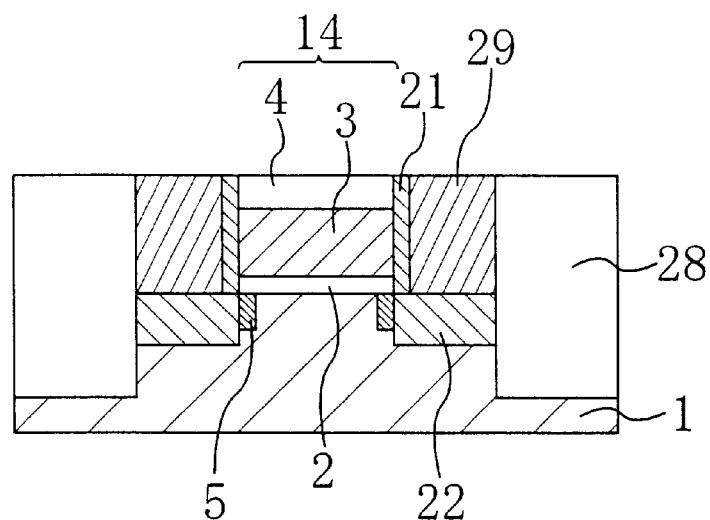
FIGS. 18A through 18C illustrate the step of forming a trench isolation film in the fabrication process of the second embodiment.
Figure 18B:
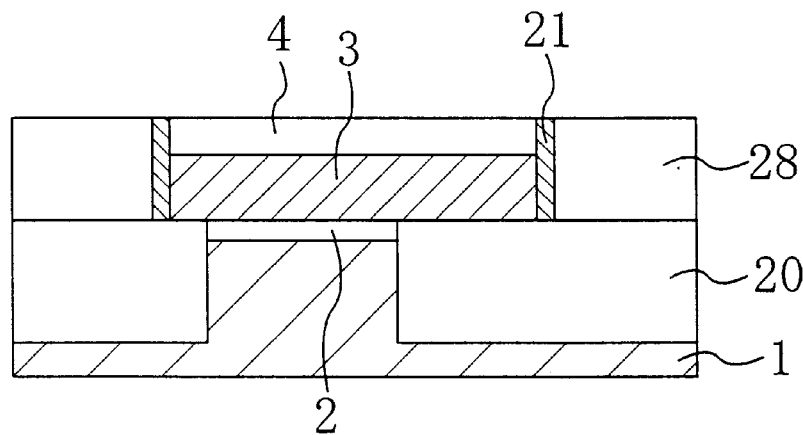
Figure 18C:
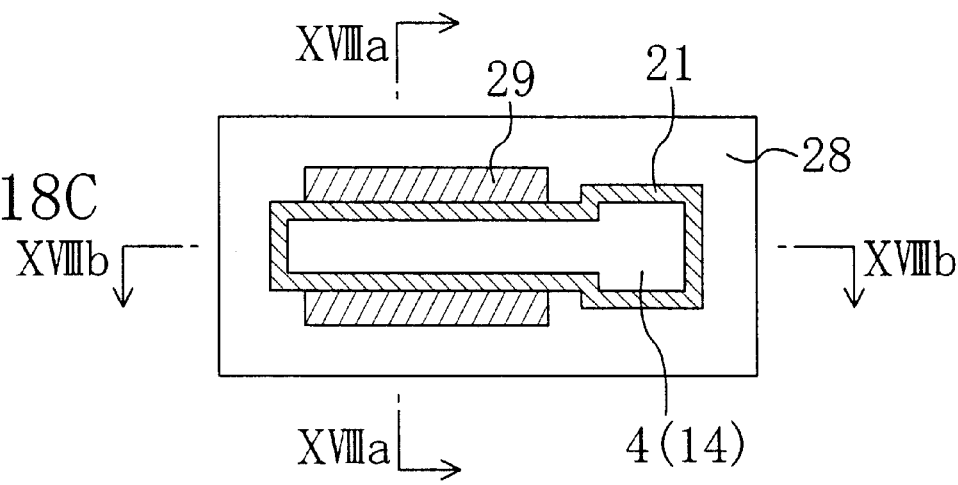

Next, in the process step shown in FIGS. 18A through 18C, a CVD silicon dioxide film is deposited to a thickness of about 1.2 μm over the substrate. Then, the upper surface of the CVD silicon dioxide film is planarized by a chemical/mechanical polishing (CMP) process until at least the upper insulating film 4 and source/drain contacts 29 are exposed. In this manner, the trenches 26 are filled in with the CVD silicon dioxide film, thereby forming the isolation film 28. In this case, the CMP process may be performed until the upper parts of the source/drain contacts 29 are removed to a certain depth. Alternatively, only the CVD silicon dioxide film may have its upper surface planarized by the CMP process first, and then the surfaces of the upper insulating film 4 and source/drain contacts 29 may be exposed by etching back the CVD silicon dioxide film.

As a result of this process step, the gate electrode section 14 is sandwiched by the trench isolation film 28 with the sidewall insulating film 21 and source/drain contacts 29 interposed therebetween in the regions where the source and drain will be formed. In the other regions, the gate electrode section 14 is surrounded by the isolation film 28 with only the sidewall insulating film 21 interposed between them. Also, the active region is electrically isolated by the isolation film 28 in the gate length direction. As a result, the size of the active region as measured in the gate length direction is defined. In addition, the upper surfaces of the isolation film 28, upper insulating film 4 and source/drain contacts 29 are planarized to substantially the same levels. Furthermore, the outer ends of the heavily doped source/drain regions 22 can also be defined definitely by the isolation film 28 in the gate length direction. As a result, the shapes of the heavily doped source/drain regions 22 can be substantially matched to those of the source/drain contacts 29 in a planar layout.

In the fabrication process of this embodiment, the LDD and heavily doped source/drain regions 5 and 22 are defined in this order to be self-aligned with the gate electrode section 14 in the process steps shown in FIGS. 13A through 13C and FIGS. 14A through 14C. Thereafter, in the process steps shown in FIGS. 15A through 15C and FIGS. 16A through 16C, the sidewall conductor film 23 and source/drain contacts 29, i.e., parts of the sidewall conductor film 23, are formed beside the gate electrode section 14 to be self-aligned with the gate electrode section 14. Then, in the process steps shown in FIGS. 17A through 17C and FIGS. 18A through 18C, the trenches 26 and isolation film 28 are formed to be self-aligned with the gate electrode 3 and source/drain contacts 29. That is to say, the LDD regions 5, heavily doped source/drain regions 22, sidewall insulating film 21, isolation film 28 and source/drain contacts 29 can all be self-aligned with the gate electrode 3.

Accordingly, the source/drain contacts 29 and heavily doped source/drain regions 22 can be formed to less than the minimum opening size without being limited by the mask overlay accuracy or minimum opening size. Thus, the width of the active region can be reduced considerably.

Particularly, in the fabrication process of the second embodiment, the process steps of forming contact holes and filling those holes with a conductor such as tungsten as required by the first embodiment can be omitted by using the sidewall conductor film 23 as a prototype of the source/drain contacts 29 instead of the sidewall dummy. Thus, the fabrication process of the second embodiment is simpler than that of the first embodiment. Also, unlike the method of forming the source/drain contacts 13 by filling in the holes 11 with a conductor such as tungsten according to the first embodiment, the conductor film to be deposited can be as thin as possible according to the second embodiment as a matter of principle. Thus, the size of the source/drain contacts 29 can be reduced much more easily compared to the first embodiment.

Furthermore, the active region is sandwiched by the gate-width-defining trench isolation film 20 in the gate width direction. Thus, the variation in electrical characteristics (e.g., threshold voltage and I-V characteristic) of the resultant semiconductor device can be suppressed.

Embodiment 3

FIGS. 19A through 19D are cross-sectional views, taken in the gate length direction, illustrating respective process steps for fabricating a semiconductor device according to a third embodiment of the present invention. The process of the third embodiment is a partial modification to the processes of the first and second embodiments. The third embodiment is applicable to both the first and second embodiments. In the following description, however, the third embodiment will be applied to the fabrication process of the first embodiment for illustrative purposes only.

Figure 19A:
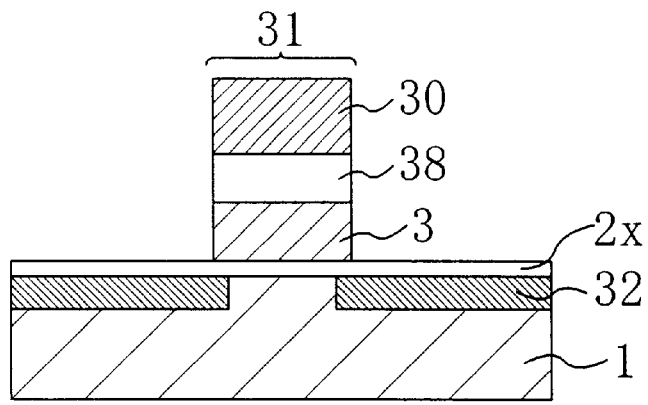
FIGS. 19A through 19D are cross-sectional views, taken in the gate length direction, illustrating respective process steps for fabricating a semiconductor device according to a third embodiment of the present invention.

First, in the process step shown in FIG. 19A, the surface of the Si substrate 1 is thermally oxidized to form a silicon dioxide film 2x thereon to a thickness of about 5 nm. Thereafter, a polysilicon film, a low-resistance film consisting of titanium nitride and tungsten films with thicknesses of about 10 nm and about 90 nm, respectively, a silicon nitride film and a CVD silicon dioxide film are deposited by a CVD process in this order on the silicon dioxide film 2x. The polysilicon, low-resistance, silicon nitride and CVD silicon dioxide films are deposited to respective thicknesses of about 100 nm, about 100 nm, about 150 nm and about 200 nm. Then, a resist pattern (not shown) for gate electrode is defined and these films are dry-etched, thereby patterning the CVD silicon dioxide, silicon nitride, low-resistance and polysilicon films. In this manner, the CVD silicon dioxide film is shaped into a second upper insulating film 30, the silicon nitride film is shaped into a first upper insulating film 38 and the low-resistance and polysilicon films are shaped into the gate electrode 3. As a result of this process step, a gate electrode section 31 consisting of the gate electrode 3 and first and second upper insulating films 38 and 30 is formed. In this process step, the silicon dioxide film 2x may be patterned into the same shape as the gate electrode 3.

Thereafter, dopant ions are lightly implanted into the Si substrate 1 by the large-angle-tilt ion implantation. In this case, a resist film (not shown), which has an opening at least over the regions where the source and drain will be formed, and the gate electrode section 31 are used as a mask. In this manner, LDD regions 32 are defined to be self-aligned with the gate electrode section 31. If only a part of the silicon dioxide film 2x is left under the gate electrode 3 in the step shown in FIG. 19A, a thin passivation film may be formed to a thickness of about 5 nm on the exposed surface of the substrate before the ion implantation is carried out to define the LDD regions 32.

Figure 19B:
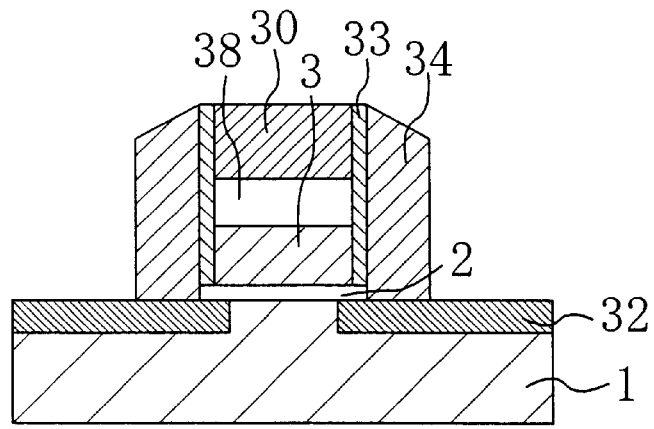

Next, in the process step shown in FIG. 19B, a silicon nitride film is deposited to a thickness of about 20 nm over the substrate and then etched back, thereby forming a sidewall insulating film 33 on the side faces of the gate electrode section 31 in a self-aligned manner. Then, the exposed parts of the silicon dioxide film 2x are removed by over etching, thereby defining the gate insulating film 2 under the gate electrode 3 and sidewall insulating film 33. Thereafter, a PSG film is deposited to a thickness of about 60 ni over the substrate and then etched back, thereby forming a sidewall dummy 34 on the side faces of the sidewall insulating film 33 so that the sidewall dummy 34 is self-aligned with the gate electrode section 31.

Figure 19C:
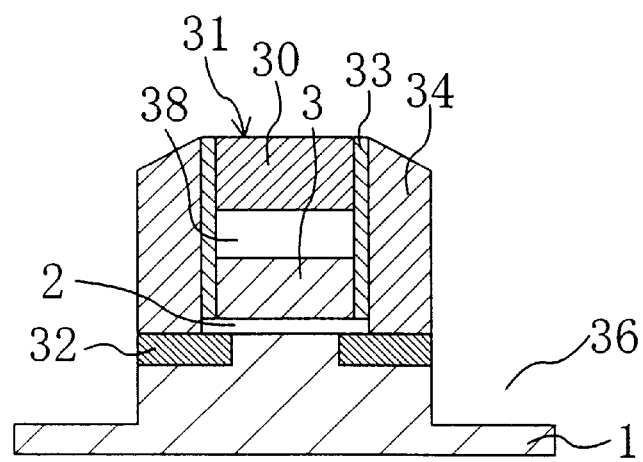

Then, in the process step shown in FIG. 19C, the exposed parts of the Si substrate 1 are selectively etched vertically using the gate electrode section 31, sidewall insulating film 33 and sidewall dummy 34 as a mask. In this manner, a trench 36 is formed to a depth of 0.3 $\mu$m to be self-aligned with the gate electrode section 31 as in the first embodiment. As in the first embodiment, before this process step is performed, part of the sidewall dummy 34 is selectively wet-etched away with a selective etchant such as hydrofluoric acid using, as a mask, a resist film covering the regions where the source and drain will be formed. In this manner, the sidewall dummy 34 is etched into the same shape as the contact dummies according to the first embodiment.

Figure 19D:
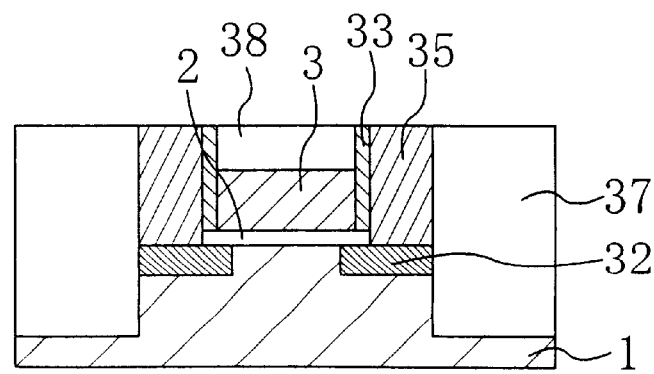

Next, in the process step shown in FIG. 19D, a CVD silicon dioxide film is deposited to a thickness of about 1.2 μm over the substrate and then planarized by a CMP process until the surface of the first upper insulating film 38 is exposed. In this manner, the trench 36 is filled in with the CVD silicon dioxide film, thereby forming an isolation film 37. In this process step, after part of the CVD silicon dioxide film over the second upper insulating film 30 has been removed, not only the second upper insulating film 30 but also the upper parts of the sidewall dummy 34 and sidewall insulating film 33 are removed as well. As a result, the respective upper surfaces of the isolation film 37, first upper insulating film 38 and contact dummies 35 are planarized to substantially the same levels.

Thereafter, the heavily doped source/drain regions and source/drain contacts are formed by performing the same process steps as those of the first embodiment shown in FIGS. 8A through 8C and FIGS. 9A through 9C. In this manner, an MIS transistor with almost the same structure as that shown in FIGS. 1A through 1C is completed.

In the fabrication process of the third embodiment, the second upper insulating film 30 is formed on the first upper insulating film 38. Thus, even if the upper part of the side-wall dummy 34 inclines unintentionally in the process step shown in FIG. 19B, that inclined upper part is removable by planarizing the structure in the process step shown in FIG. 19D until the surface of the first upper insulating film 38 is exposed. As a result, the upper surface of the contact dummies 35 can be planarized to have the same area as the lower surface thereof. And by selectively removing these contact dummies 35, the contact holes can be formed in an even better shape compared to the first embodiment. As a result, the source/drain contacts can be formed in a very good shape.

It should be noted that if this technique of providing the first and second upper insulating films is applied to the second embodiment, the source/drain contacts can also be formed in a good shape.

Alternative Embodiments

Figure 20A:
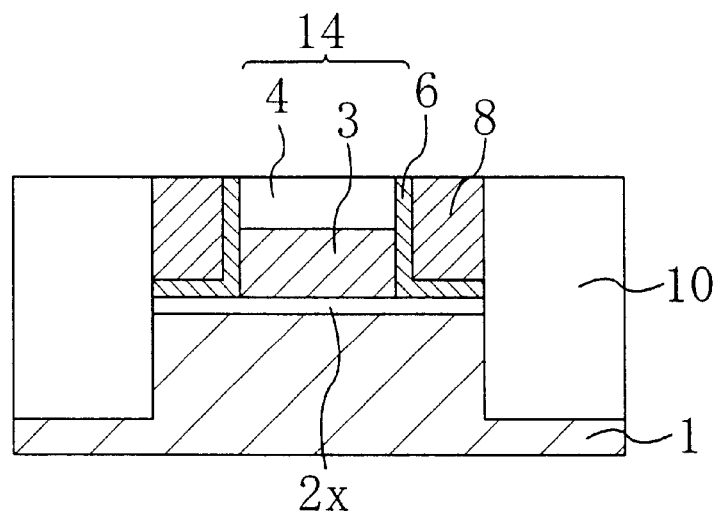
FIGS. 20A through 20C are cross-sectional views, taken in the gate length direction, illustrating alternative process steps of defining LDD and heavily doped source/drain regions according to another embodiment of the present invention.
Figure 20B:
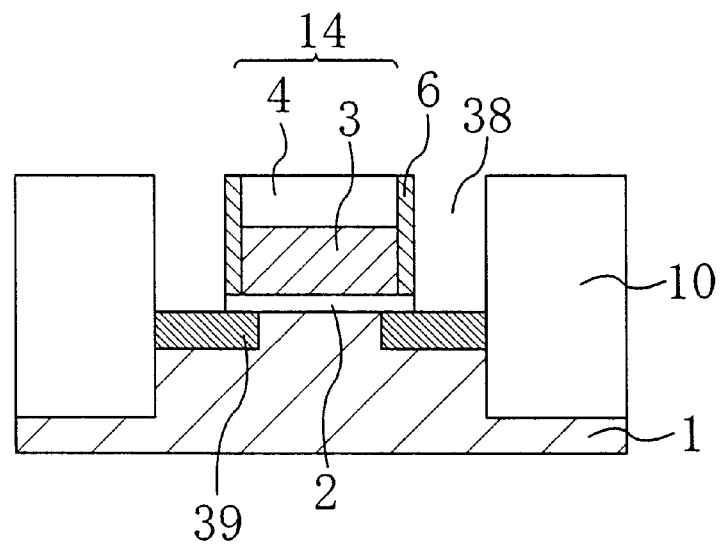
Figure 20C:
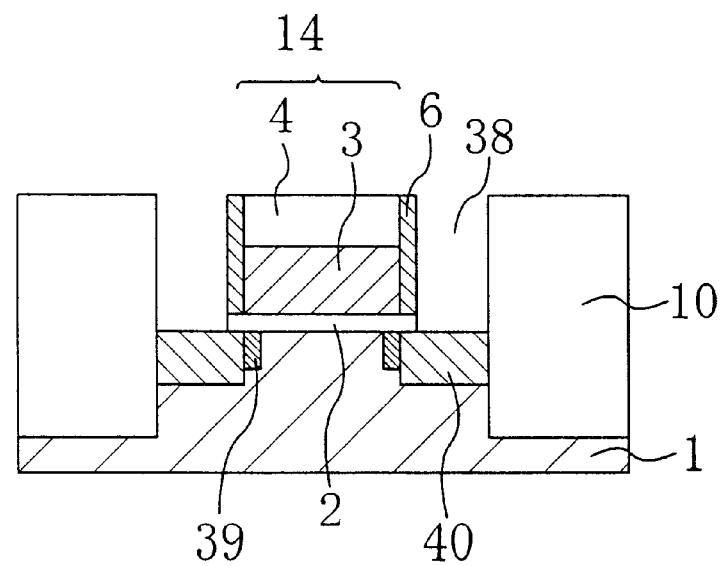

FIGS. 20A through 20C are cross-sectional views illustrating alternative process steps for defining the LDD and heavily doped source/drain regions according to a modified embodiment of the present invention. This embodiment is applicable to the first embodiment.

First, all the process steps of the first embodiment shown in FIGS. 2A through 7C, except the process step for defining the LDD regions 5 shown in FIGS. 3A through 3C, are carried out as in the first embodiment. As a result, the gate insulating film 2, gate electrode 3, upper insulating film 4, sidewall insulating film 6, contact dummies 8 and isolation film 10 are formed on the Si substrate 1 as shown in FIG. 20A. At this point in time, the structure shown in FIG. 20A is almost the same as the counterpart of the first embodiment shown in FIG. 7A. However, the structure shown in FIG. 20A is different from that shown in FIG. 7A in that the former structure includes no LDD regions 5 shown in FIG. 7A.

Next, in the process step shown in FIG. 20B, the contact dummies 8 are selectively wet-etched away with a selective etchant such as hydrofluoric acid. And exposed parts of the silicon dioxide film 2x and sidewall insulating film 6, which were located under the removed parts of the contact dummies 8, are etched away anisotropically. In this manner, contact holes 38 are formed to be self-aligned with the gate electrode section 14 (or the gate electrode 3). Thereafter, dopant ions are lightly introduced into the Si substrate 1 by large-angle-tilt ion implantation using the gate electrode section 14, sidewall insulating film 6 and isolation film 10 as a mask, thereby defining LDD regions 39. Accordingly, the LDD regions 39 are self-aligned with the gate electrode section 14.

Thereafter, in the process step shown in FIG. 20C, dopant ions are implanted almost vertically and heavily into the Si substrate 1 using the gate electrode section 14, sidewall insulating film 6 and isolation film 10 as a mask, thereby defining heavily doped source/drain regions 40. In this case, the heavily doped source/drain regions 40 are self-aligned with the gate electrode section 14.

It should be noted that how deep and how far the LDD and heavily doped source/drain regions 39 and 40 will reach under the gate electrode is controllable by the angle of ion implantation, anneal temperature and ion species, for example.

Subsequently, although not shown, the same process step as that of the first embodiment illustrated in FIGS. 9A through 9C is performed to form the source/drain contacts by filling in the contact holes 38 with a conductor such as tungsten.

According to this alternative method, there is no need to perform the photolithographic process for defining the LDD regions 5 in accordance with the first embodiment shown in FIGS. 3A through 3C. In addition, according to this method, the LDD and heavily doped source/drain regions 39 and 40 are defined just before the source/drain contacts are formed. Thus, shallow LDD and heavily doped source/drain regions 39 and 40 can be formed with their lateral diffusion reduced.

Figure 21A:
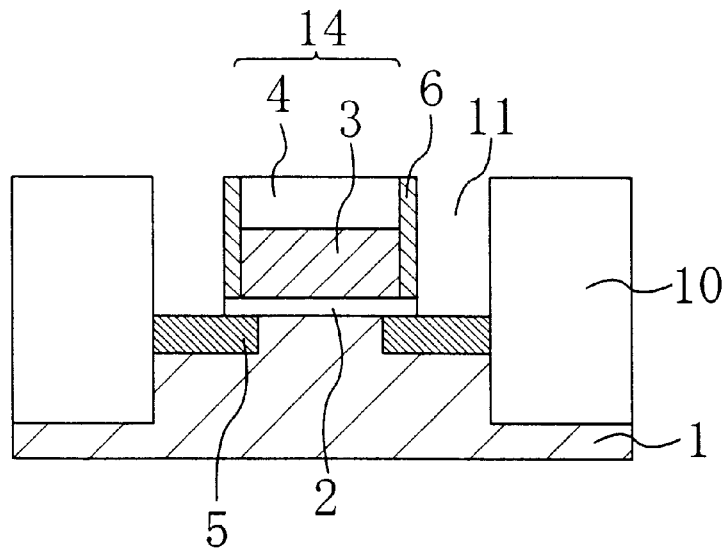
FIGS. 21A through 21C are cross-sectional views, taken in the gate length direction, illustrating alternative process steps of defining heavily doped source/drain regions according to still another embodiment of the present invention.
Figure 21B:
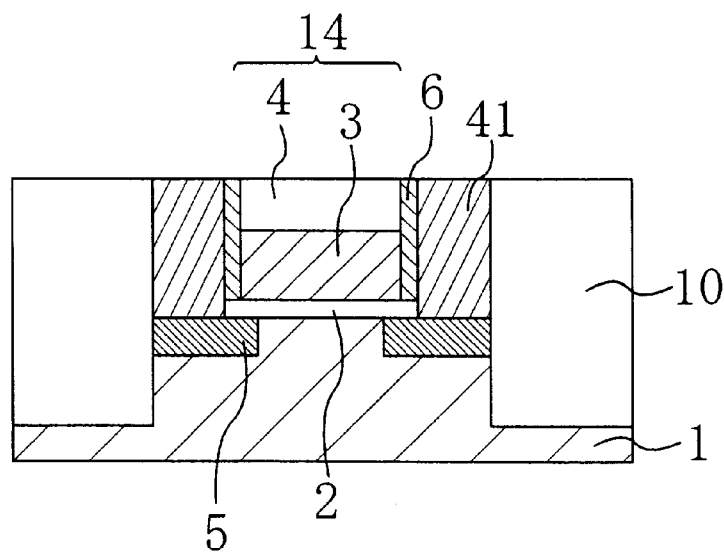
Figure 21C:
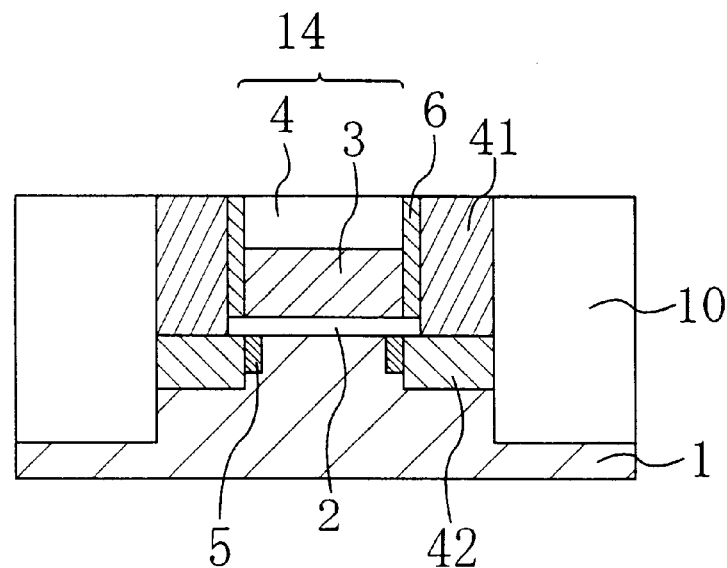

FIGS. 21A through 21C are cross-sectional views illustrating alternative process steps for forming heavily doped source/drain regions according to another modified embodiment of the present invention. This embodiment is also applicable to the first embodiment.

First, almost all the process steps of the first embodiment shown in FIGS. 2A through 8C are carried out as in the first embodiment. As a result, the gate insulating film 2, gate electrode 3, upper insulating film 4, sidewall insulating film 6, contact holes 11, LDD regions 5 and isolation film 10 are formed on the Si substrate 1 as shown in FIG. 21A. At this point in time, the structure shown in FIG. 21A is almost the same as the counterpart of the first embodiment shown in FIG. 8A. However, the structure shown in FIG. 21A is different from that shown in FIG. 8A in that the former structure includes no heavily doped source/drain regions 12 shown in FIG. 8A.

Next, in the process step shown in FIG. 21B, a heavily doped polysilicon film is deposited over the substrate and then planarized by a CMP process or etched back, thereby filling in the contact holes 11 with the polysilicon film. In this manner, source/drain contacts 41 containing a high-concentration dopant are formed.

Then, in the process step shown in FIG. 21C, the dopant contained in the source/drain contacts 41 is thermally diffused into the Si substrate 1, thereby defining heavily doped source/drain regions 42 self-aligned with the gate electrode section 14.

According to this alternative method, the heavily doped source/drain regions 42 are formed by diffusing the high-concentration dopant from the source/drain contacts 41. Thus, the resultant heavily doped source/drain regions 42 have a shallow diffusion depth.

In the first embodiment, the active region is surrounded only by the isolation film. Alternatively, the active region may be surrounded by the gate-width-defining trench isolation film and isolation film as in the second embodiment. To the contrary, in the second embodiment, the active region may be surrounded only by the isolation film as in the first embodiment without forming the gate-width-defining trench isolation film.

Also, in the process step of the first embodiment shown in FIGS. 4A through 4C, no sidewall insulating film 6 may be formed. Instead, a substitute sidewall dummy should be formed to a thickness equal to the sum of lateral sizes of the sidewall insulating film 6 and sidewall dummy 7. In that case, the contact holes 11 shown in FIG. 8A are formed between the gate electrode section 14 and isolation film 10. Accordingly, sidewall insulating films may be formed on both inner side faces of each contact hole 11 and the gap between those sidewall insulating films may be filled in with the source/drain contacts 13. Thus, the LDD regions 5 may also be defined just before those sidewall insulating films are formed. And the heavily doped source/drain regions 12 may be defined after those sidewall insulating films have been formed.

Furthermore, after the contact holes 11 shown in FIG. 8A have been formed, the sidewall insulating film 6 may be once removed. Thereafter, a silicon nitride film may be deposited to a thickness of about 20 nm and then etched back to form a new sidewall insulating film on the side faces of the gate electrode section 14. In that case, another sidewall insulating film is also formed on the exposed side faces of the isolation film 10 inside the contact holes 11. This technique is particularly advantageous if it is difficult to assure a desired etch selectivity between the sidewall dummy 7 and sidewall insulating film 6 and ensure good insulation properties for the final sidewall insulating film at a time. In such a situation, the sidewall insulating film 6 may be replaced with a conductor or semiconductor film.

Moreover, the LDD regions do not have to be provided. This is because short channel effects can also be prevented sufficiently even with just a single type of diffusion regions provided if the diffusion depth thereof is reduced, for example.

What is claimed is:

1. A semiconductor device comprising:
   a gate insulating film formed on a semiconductor substrate;
   a gate electrode formed on the gate insulating film;
   an upper insulating film formed on the gate electrode;
   a trench isolation film self-aligned with the gate electrode, the upper surface of the isolation film being located at a level higher than the upper surface of the gate electrode, the lower surface of the isolation film being located at a level lower than the upper surface of the substrate at least on a cross section of the device taken in a gate length direction;
   source/drain diffused regions defined in respective regions of the substrate beside the gate electrode; and
   source/drain contacts formed between the sidewall insulating film and the isolation film and self-aligned with the gate electrode to make electrical contact with the source/drain diffused regions; and
   a sidewall insulating film interposed between the source/drain contacts and a stack of the gate electrode and the upper insulating film,
   wherein the size of the gate electrode as measured in the gate width direction is larger than that of the source/drain contacts, and the gate electrode protrudes laterally on both sides of the source/drain contacts in the gate width direction.

2. The device of claim 1, wherein as viewed from over the device, the source/drain contacts are in substantially the same planar shape as the source/drain diffused regions in respective areas where the contacts overlap the diffused regions, and are formed only over the diffused regions.

3. The device of claim 1, wherein the size of one of the source/drain contacts as measured in the gate length direction is in the range from 0.01 $\mu$m to 0.1 $\mu$m.

4. The device of claim 1, wherein the respective upper surfaces of the upper insulating film, the isolation film and the source/drain contacts have been planarized to substantially the same levels.

5. The device of claim 1, wherein on a transversal cross section of the device taken across a part of the gate electrode, a periphery, outlining the sidewall insulating film, the gate electrode and the source/drain contacts, is surrounded by the isolation film.

6. The device of claim 1, wherein the gate electrode in its entirety is located only over the gate insulating film.

7. The device of claim 6, wherein on a transversal cross section of the device taken across a part of the gate electrode, a trench is formed in the substrate around a periphery, outlining the sidewall insulating film, the gate electrode and the source/drain contacts, and filled in with the isolation film.

8. The device of claim 1, wherein the source/drain diffused regions are composed of LDD regions and highly doped source/drain regions.

* * * * *